(12) United States Patent
Duncan et al.

(10) Patent No.: US 12,248,301 B2
(45) Date of Patent: Mar. 11, 2025

(54) ISOLATED FLOOR LOCKING MECHANISM FOR MODULAR DATA CENTERS

(71) Applicant: Dell Products L.P., Round Rock, TX (US)

(72) Inventors: Tyler Baxter Duncan, Austin, TX (US); Anthony Middleton, Cedar Park, TX (US); Ty Robert Schmitt, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 401 days.

(21) Appl. No.: 17/970,328

(22) Filed: Oct. 20, 2022

(65) Prior Publication Data

US 2024/0134347 A1 Apr. 25, 2024
US 2024/0231316 A9 Jul. 11, 2024

(51) Int. Cl.
*G05B 19/4155* (2006.01)
*H05K 7/14* (2006.01)

(52) U.S. Cl.
CPC ....... *G05B 19/4155* (2013.01); *H05K 7/1497* (2013.01); *G05B 2219/49216* (2013.01)

(58) Field of Classification Search
None
See application file for complete search history.

(56) References Cited

U.S. PATENT DOCUMENTS

2018/0058086 A1\* 3/2018 Hubbard ............... H05K 7/1495
2018/0328047 A1\* 11/2018 Canfield ........... E04F 15/02458

\* cited by examiner

*Primary Examiner* — Ryan A Jarrett
(74) *Attorney, Agent, or Firm* — Aly Z. Dossa; Chamberlain, Hrdlicka, White, Williams & Aughtry

(57) ABSTRACT

A modular information technology component (MITC) includes: a floor, in which the floor comprises a first floor plate (FP) and a second FP, in which the first FP and the second FP are oriented in a first plane; and a first hydraulic pump (HP) and a second HP, in which the first HP is located underneath the first FP, in which the second HP is located underneath the second FP, in which the first HP and the second HP are deactivated, in which, when an information handling system (IHS) is loaded on the second FP, the second FP becomes oriented in a second plane, in which the second plane is lower than the first plane, and in which, when the second FP becomes oriented in the second plane, the second HP is activated to raise the second FP to the first plane.

20 Claims, 12 Drawing Sheets

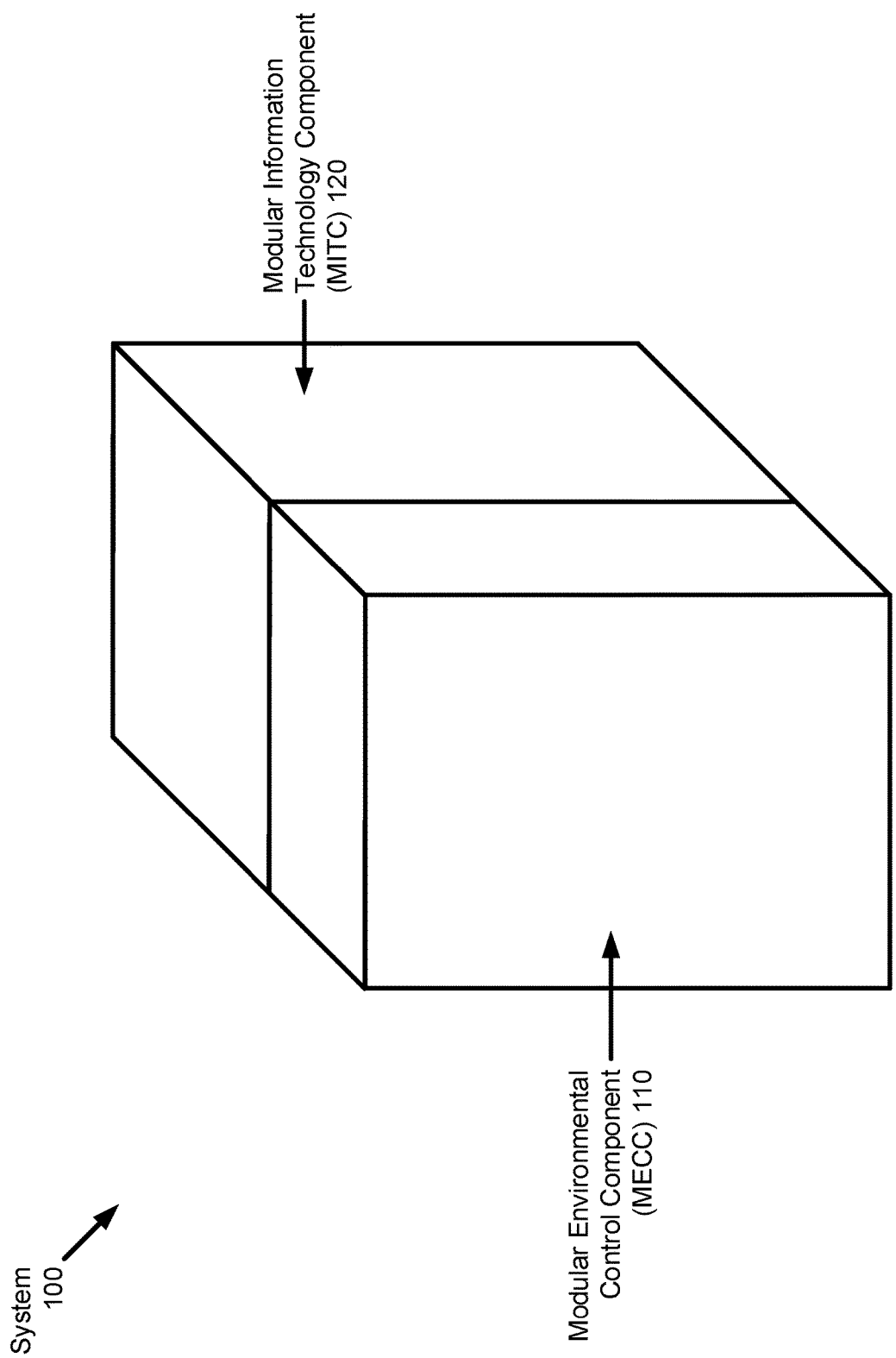

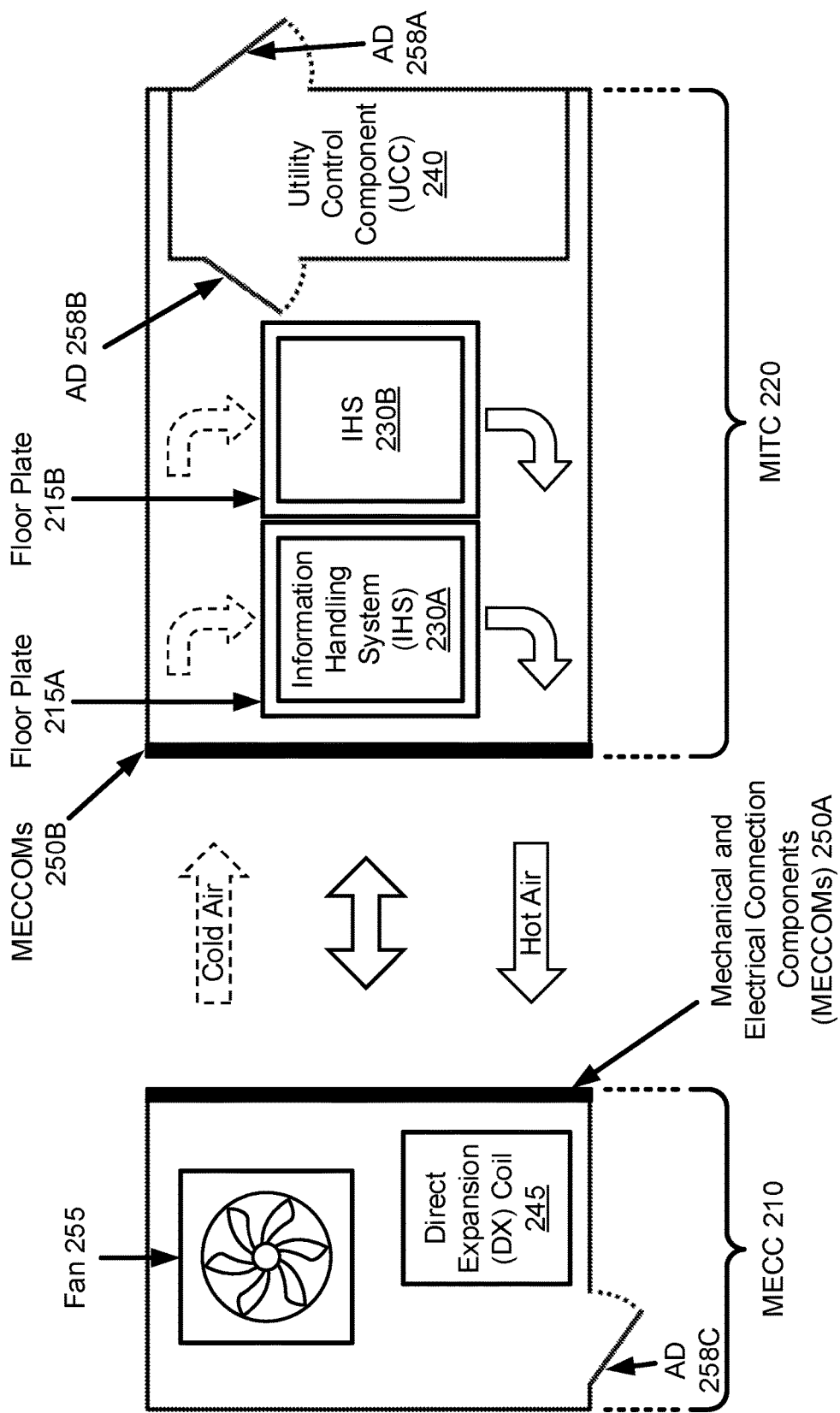
FIG. 2.1

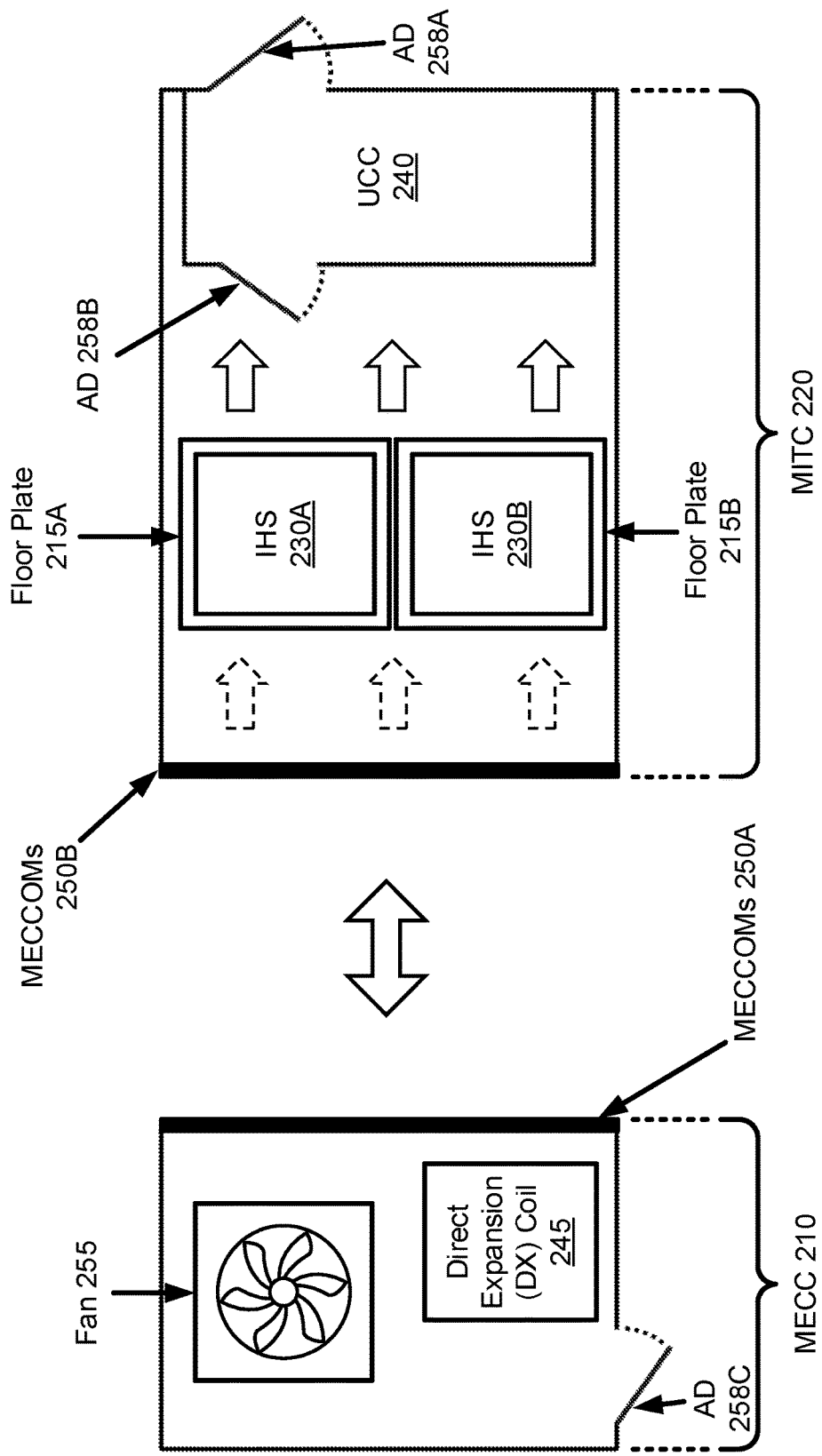
FIG. 2.2

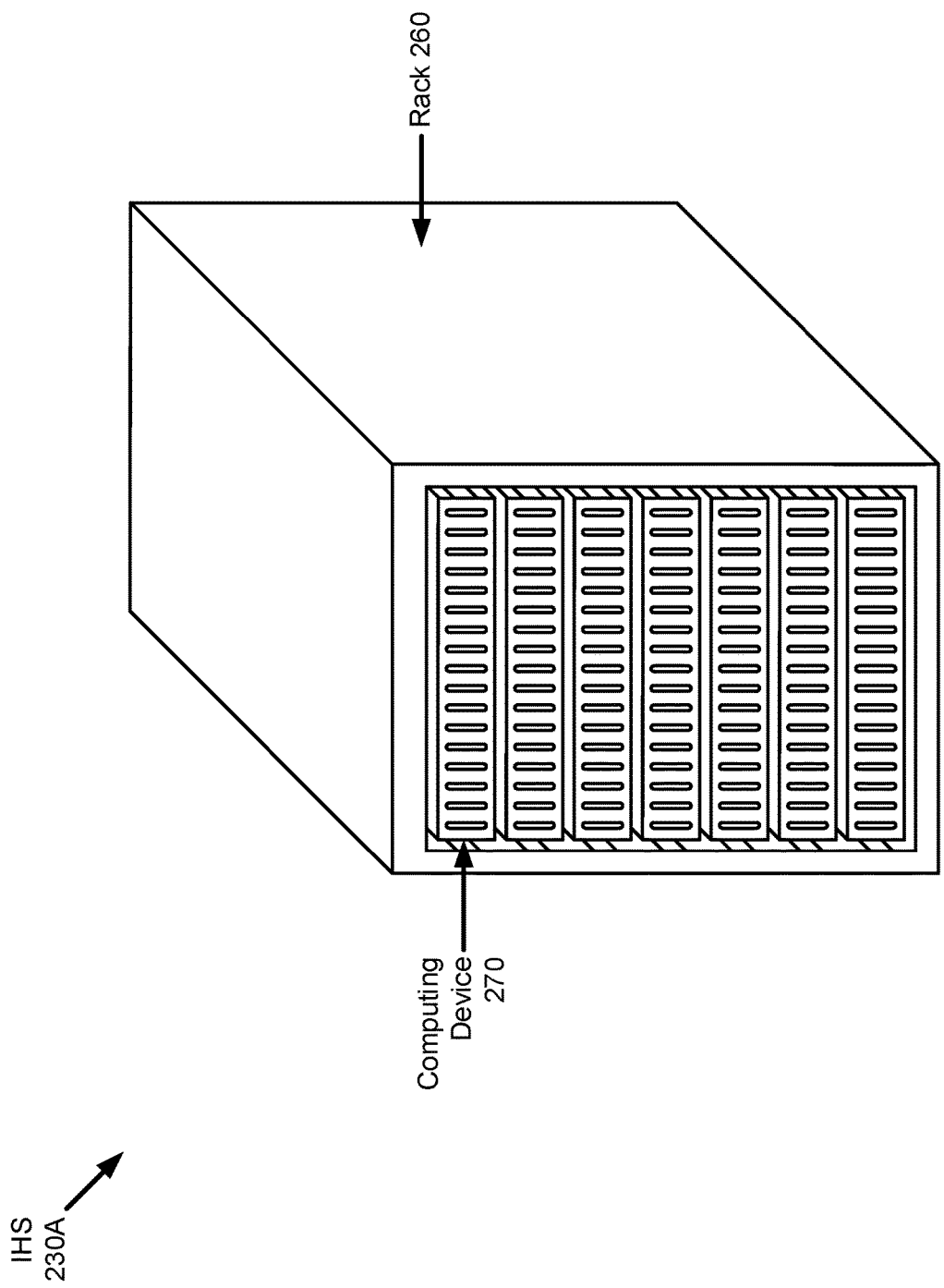
FIG. 2.3

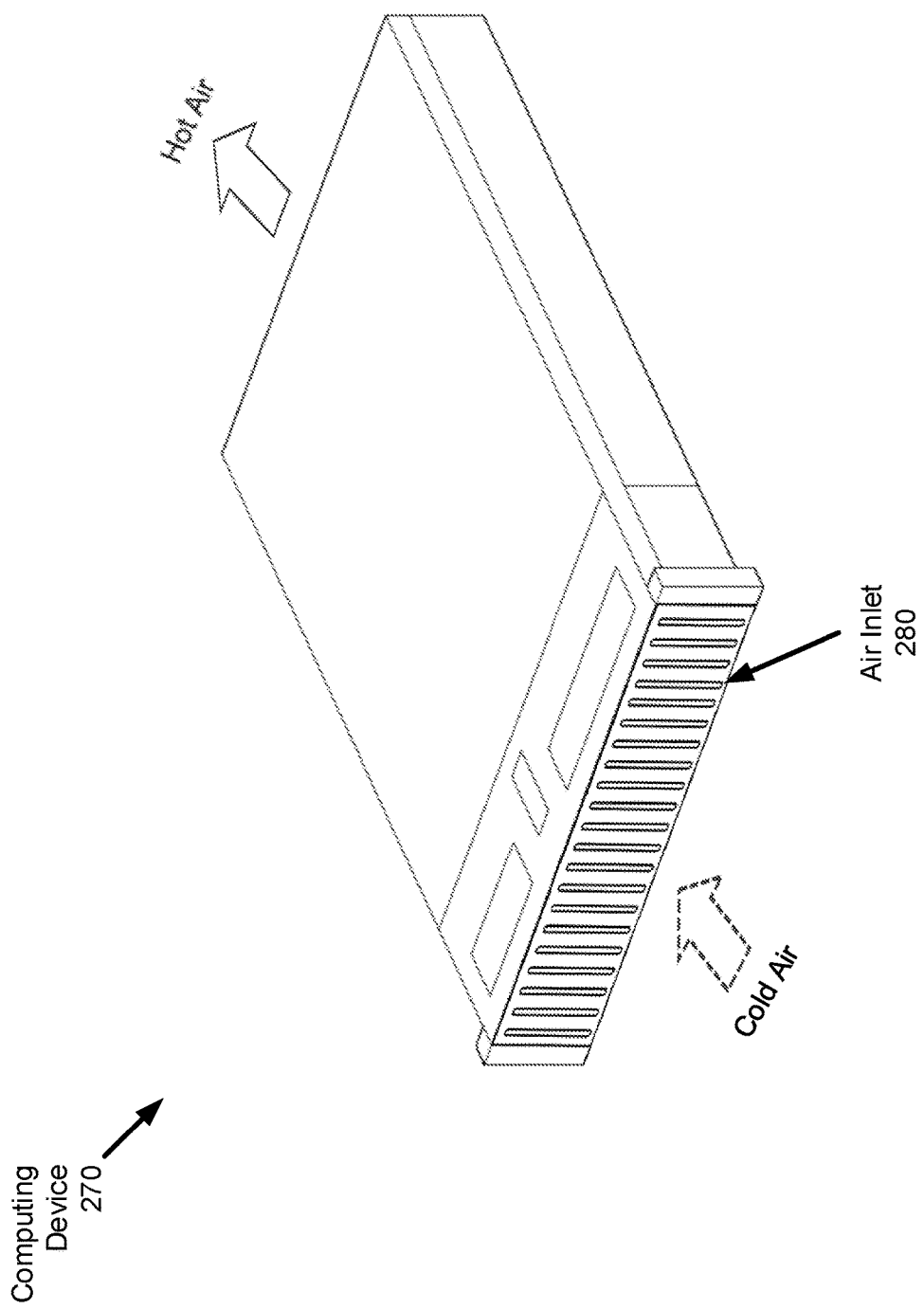
FIG. 2.4

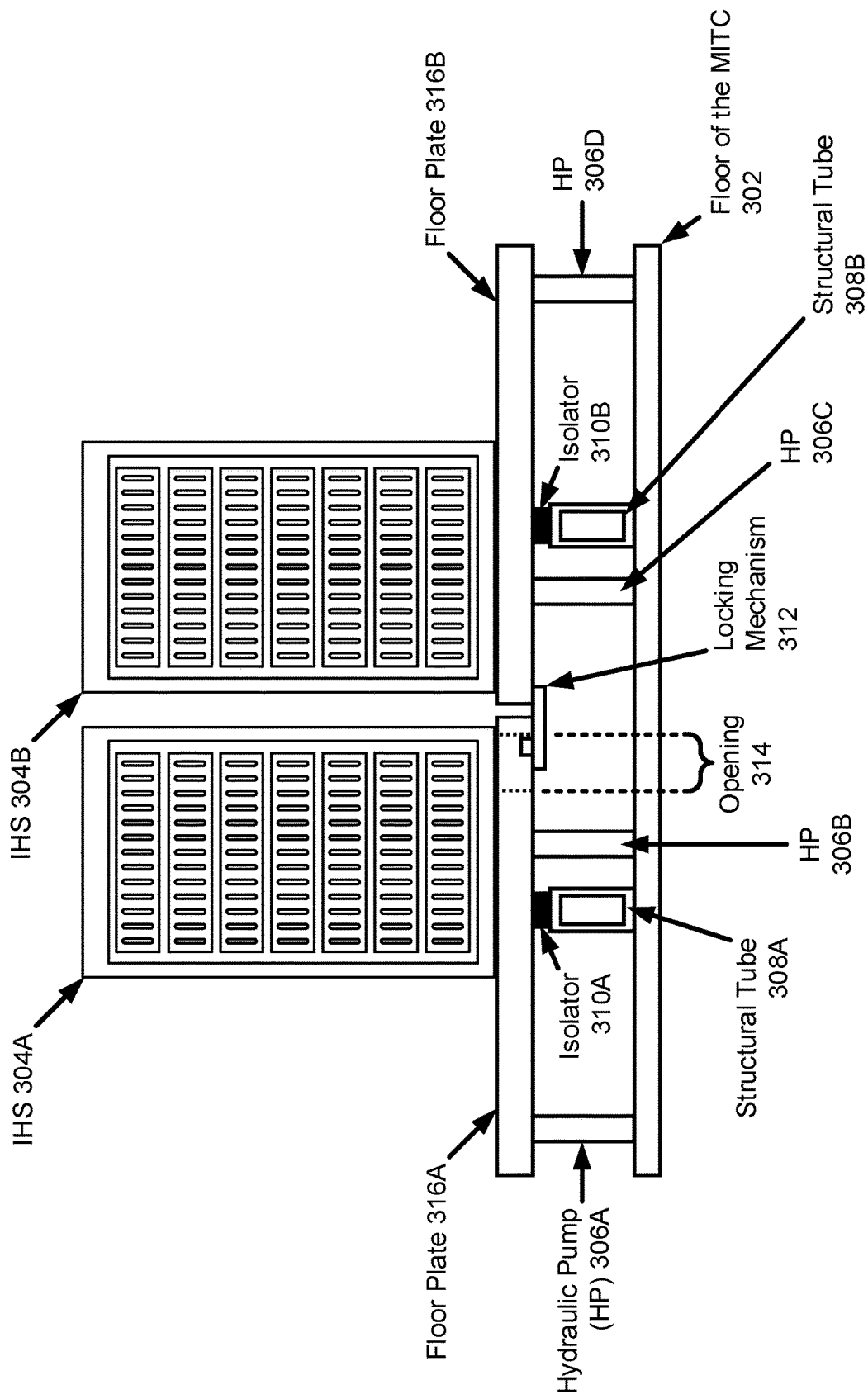
FIG. 3.1

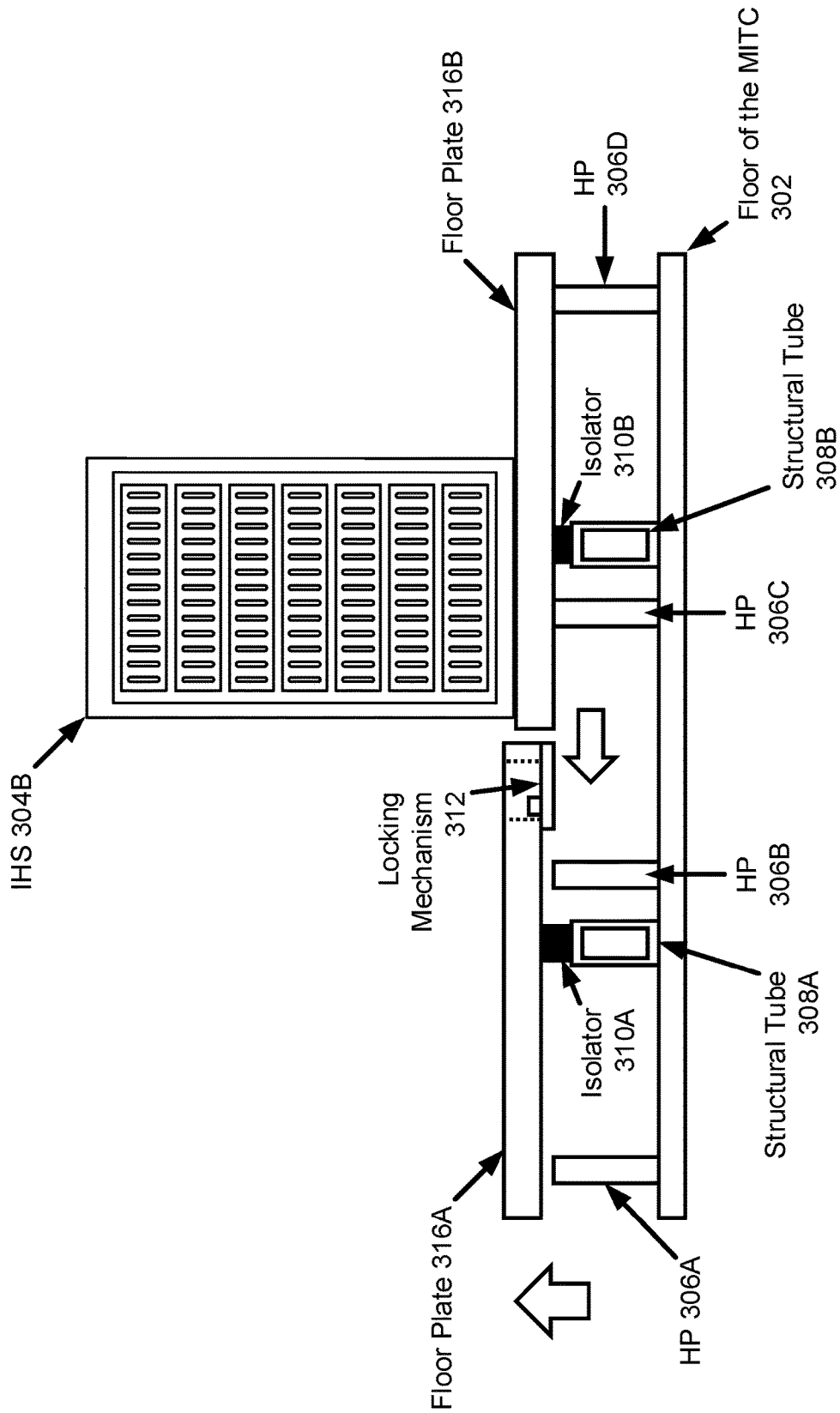
FIG. 3.2

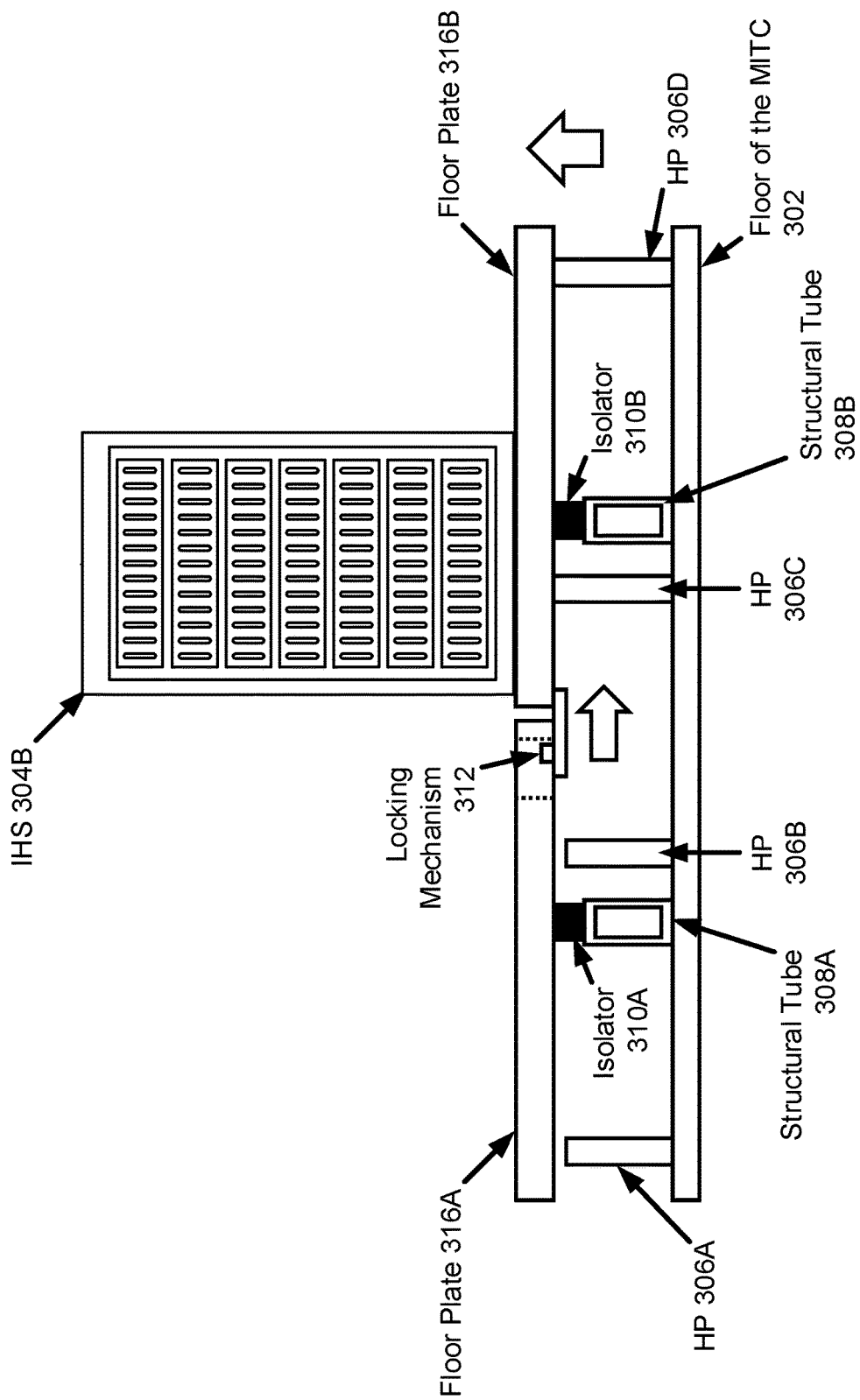
FIG. 3.3

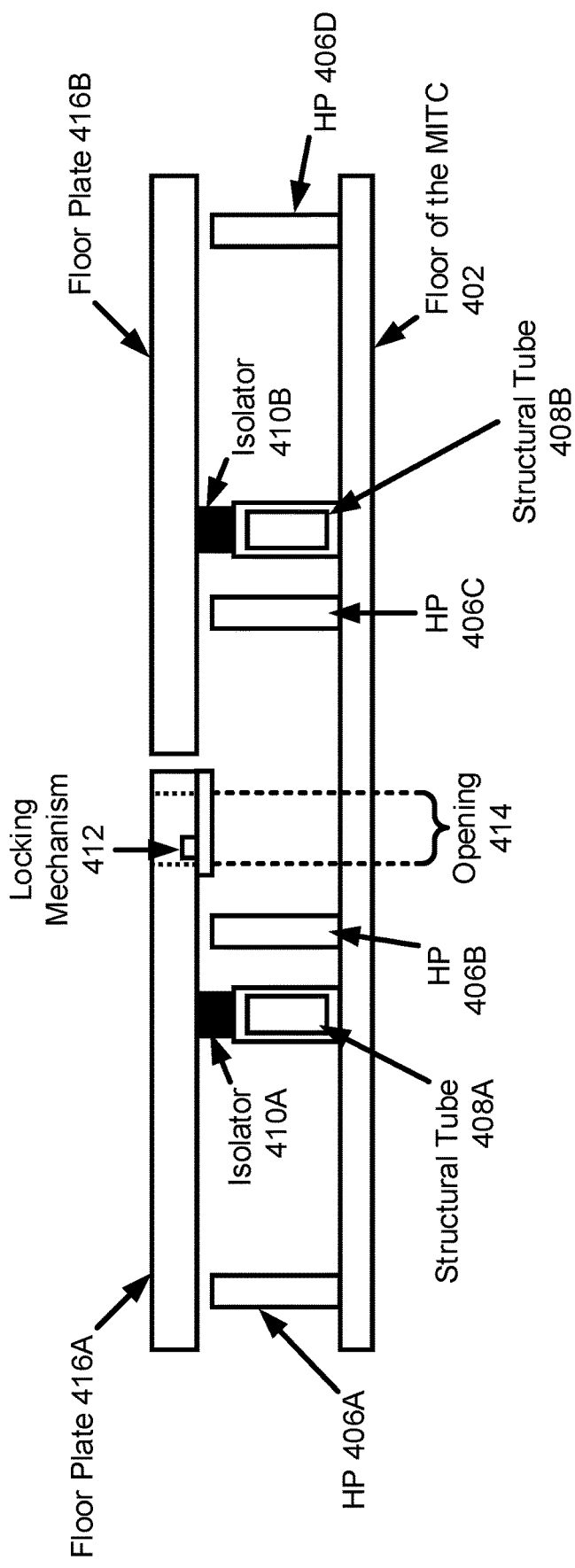
FIG. 4.1

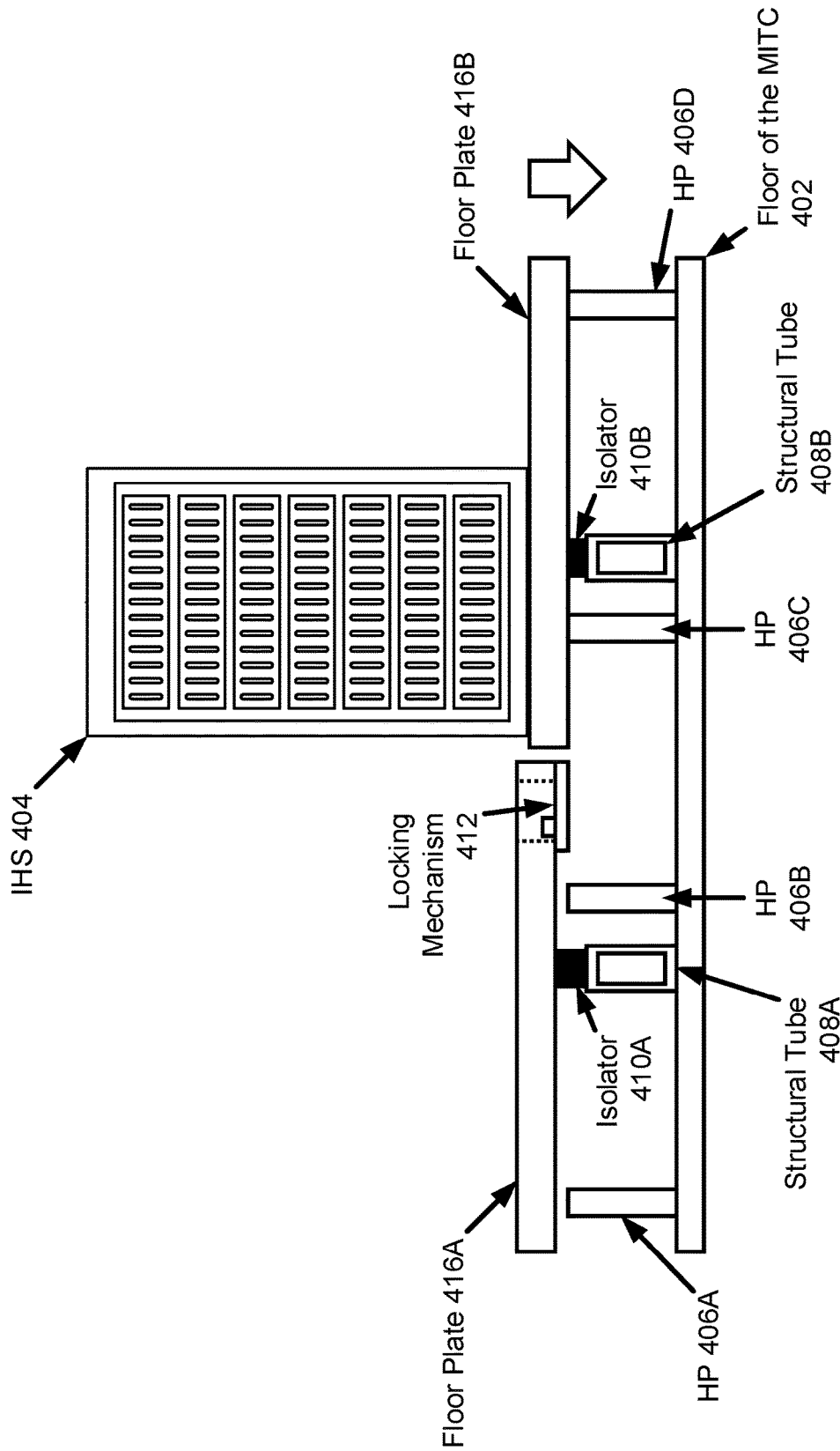
FIG. 4.2

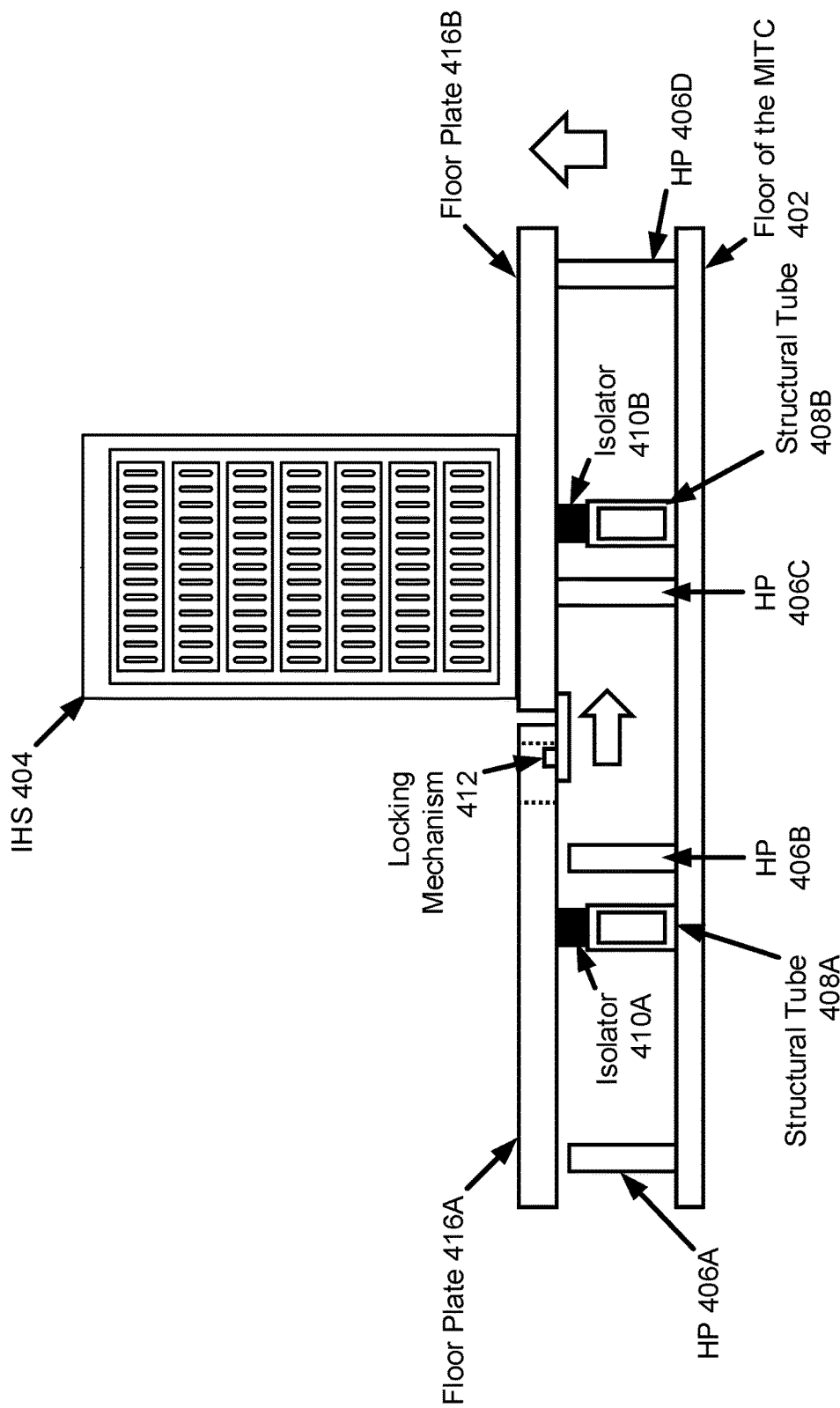
FIG. 4.3

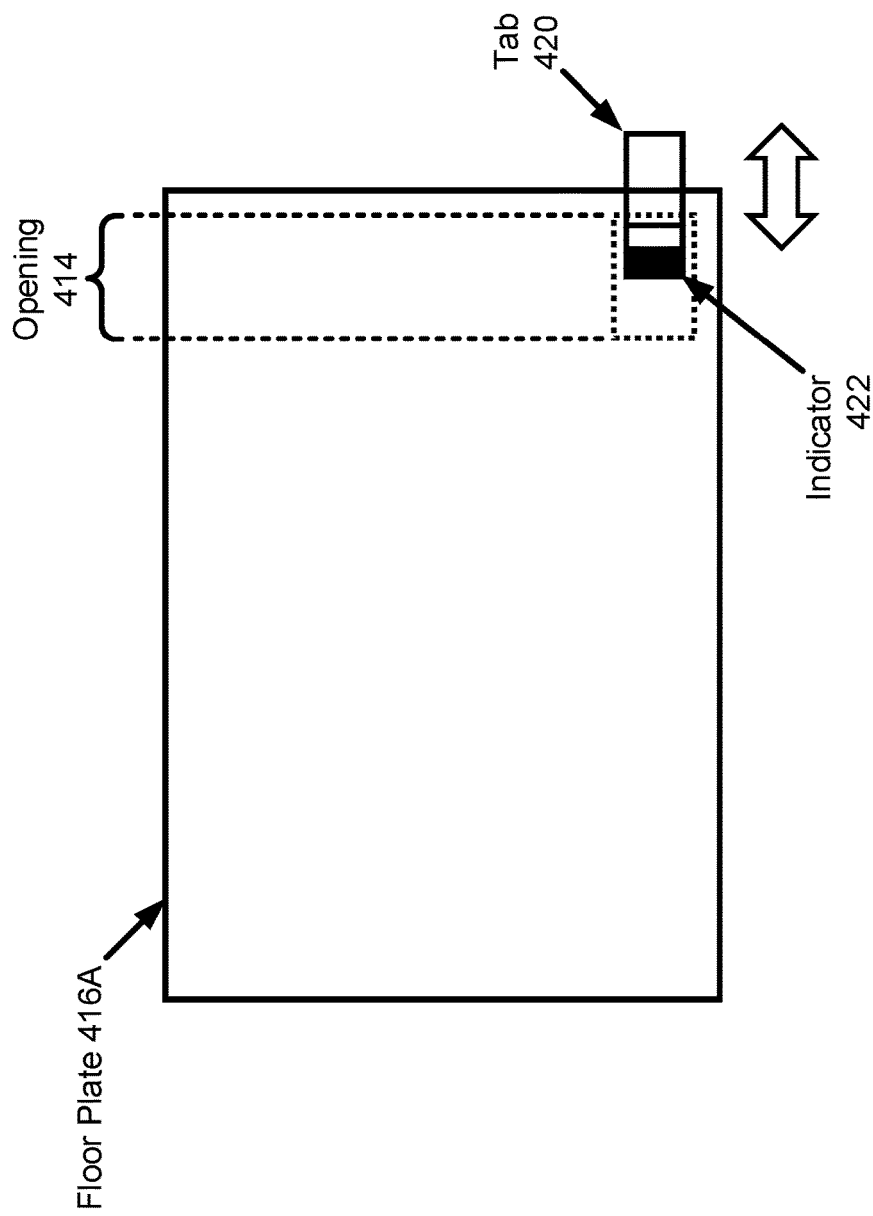
FIG. 4.4

ISOLATED FLOOR LOCKING MECHANISM FOR MODULAR DATA CENTERS

BACKGROUND

The heterogeneous data center environments witnessed today often require a combination of various cooling, power, and information technology (IT) components. The cooling, power, and IT components are available either commercially with minimum configuration options (e.g., one-size-fits-all) or through a full custom solution for a specific customer demand. This either impacts scalability of the heterogeneous data center environments, or requires resource-intensive engineering for deployment of the cooling, power, and IT components.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 1 shows a diagram of a system in accordance with one or more embodiments of the invention.

FIG. 2.1 shows a top view of the system of FIG. 1 in accordance with one or more embodiments of the invention.

FIG. 2.2 shows a top view of the system of FIG. 1 in accordance with one or more embodiments of the invention.

FIG. 2.3 shows a diagram of an information handling system (IHS) in accordance with one or more embodiments of the invention.

FIG. 2.4 shows a diagram of a computing device in accordance with one or more embodiments of the invention.

FIGS. 3.1-3.3 show an unloading process of an IHS from a floor in accordance with one or more embodiments of the invention.

FIGS. 4.1-4.3 show a loading process of an IHS on a floor in accordance with one or more embodiments of the invention.

FIG. 4.4 shows a top view of a floor plate in accordance with one or more embodiments of the invention.

DETAILED DESCRIPTION

Specific embodiments of the invention will now be described in detail with reference to the accompanying figures. In the following detailed description of the embodiments of the invention, numerous specific details are set forth in order to provide a more thorough understanding of one or more embodiments of the invention. However, it will be apparent to one of ordinary skill in the art that one or more embodiments of the invention may be practiced without these specific details. In other instances, well-known features have not been described in detail to avoid unnecessarily complicating the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N. As used herein, the aforementioned labeling means that the element may include any number of items, and does not require that the element include the same number of elements as any other item labeled as A to N. For example, a data structure may include a first element labeled as A and a second element labeled as N. This labeling convention means that the data structure may include any number of the elements. A second data structure, also labeled as A to N, may also include any number of elements. The number of elements of the first data structure, and the number of elements of the second data structure, may be the same or different.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct connection (e.g., wired directly between two devices or components) or indirect connection (e.g., wired and/or wireless connections between any number of devices or components connecting the operatively connected devices). Thus, any path through which information may travel may be considered an operative connection.

In general, before shipping a modular data center (MDC) to a customer site, components (e.g., IHSs, cooling distribution units (CDUs), etc.) of the MDC need to be pre-integrated into a floor within the MDC for safety purposes. Once the components are pre-integrated, the MDC may then be shipped to the customer site. Typically, the floor includes multiple floor plates (FPs), for example, a first FP and a second FP, in which both FPs are oriented in a first plane. However, for example, when an IHS is loaded on the second FP, the second FP becomes oriented in a second plane, in which the second plane is lower than the first plane. The misalignment of the FPs generates issues, for example, when a customer wants to roll the IHS from the second FP to the first FP.

To address one or more of the aforementioned issues, embodiments of the invention provide an isolated floor locking mechanism to keep both FPs in the first plane even if an IHS is loaded on the second FP. More specifically, embodiments of the invention describe how to keep both FPs in the same plane if an IHS is loaded on one of the FPs, or if an IHS is unloaded from one of the FPs. This advantageously provides a better user experience and a better serviceability when loading or unloading an IHS on or from the floor, and/or when rolling an IHS from one FP to another FP.

The following describes various embodiments of the invention.

As used herein, an "MDC" includes any facility or a portion of a facility in which computing operations are carried out. An MDC may include IHSs and IHS components coupled together as functional IHSs, in which the IHSs and the functional IHSs are dedicated to serve specific functions or to serve multiple functions. Examples of computing operations may include (but not limited to): information processing, communications, testing, simulations, power distribution and control, operational control, etc.

Turning now to FIG. 1, FIG. 1 shows a diagram of a system (100) in accordance with one or more embodiments of the invention. The system (100) includes a modular information technology component (MITC) (120) and a modular environmental control component (MECC) (110). The system (100) may include additional, fewer, and/or different components (e.g., modular building blocks) without departing from the scope of the invention. Each component illustrated in FIG. 1 is described below in reference to FIG. 2.1.

Turning now to FIG. 2.1, FIG. 2.1 shows a top view of the system of FIG. 1 in accordance with one or more embodiments of the invention. In an embodiment of the invention shown in FIG. 2.1, the MITC (220) may be a mechanical structure that enables one or more IHSs (230A, 230B) and a utility control component (UCC) (240) to be disposed within the MITC (220).

In one or more embodiments, while disposing, the IHSs (230A, 230B) may be affixed to a first FP (215A) and a second FP (215B), respectively, of a floor within the MITC (220) via standard mechanical mechanisms (e.g., bolts, screws, nuts, studs, etc.). In one or more embodiments, the FPs (215A, 215B) are affixed to a bottom side of the MITC (220). Other mechanical or non-mechanical (e.g., glue, an adhesive tape, etc.) mechanisms for affixing the IHSs (230A, 230B) to the FPs (215A, 215B) may be used without departing from the scope of the invention. Additional details of the FPs are described below in reference to FIGS. 3.1-4.4.

In one or more embodiments, a white space within the MITC (220), where the floor is located, may have a functionality to host different types of standard racks (e.g., 4×750 millimeter (mm) wide racks, 5×600 mm wide racks, 5×48 rack unit (RU) racks, etc.). As a unit of measurement, the RU is equal to 1.75 inches and the RU defines an increment within a standard rack. The white space may also have a functionality to host custom designed racks. Both standard (e.g., off-the-shelf) and custom designed racks may be pre-integrated into the floor before transportation to the customer site (e.g., a customer location, a customer facility, etc.).

In one or more embodiments, apart from hosting the IHSs (230A, 230B), the white space may also host other components, for example (but not limited to): immersion tanks, uninterruptible power supplies (UPSs), CDUs, battery racks, cable management towers, etc.

The aforementioned example is not intended to limit the scope of the invention.

In one or more embodiments, the MITC (220) may be implemented as other types of structures adapted to host, position, orient, and/or otherwise physically, mechanically, electrically, and/or thermally manage the IHSs (230A, 230B) and the UCC (240). In this manner, the MITC (220) may enable the IHSs (230A, 230B) and the UCC (240) to be densely packed without negatively impacting the operation of the IHSs (230A, 230B) and the UCC (240).

In one or more embodiments, an IHS (e.g., 230A) may include a rack and any number of computing devices. Additional details of the IHS are described below in reference to FIGS. 2.3 and 2.4.

In one or more embodiments, the UCC (240) is integrated within the MITC (220) to support different types of IHSs, in which the UCC-integrated MITC is manufactured as a monolithic system. This implies that the UCC (240) is not a separate, standalone component.

In one or more embodiments, the UCC (240) may include one or more physical devices (e.g., panels, units, switchboards, etc.) that may provide functionality, for example (but not limited to): to detect a temperature within a system, to detect fire/smoke within a system, to suppress fire/smoke within a system, to provide an access control to a component, to manage a power distribution to a component, to manage a temperature within a system, etc.

The aforementioned example is not intended to limit the scope of the invention.

In one or more embodiments, the UCC (240) may include an environmental control component (ECC) control panel (not shown) that is configured to manage a temperature within the system (e.g., 100, FIG. 1) and to provide heating and/or cooling control services. The heating and/or cooling control services may include, for example (but not limited to): (i) obtaining information relating to a temperature of one or more components within the system (e.g., 100, FIG. 1), where the information may be obtained through a number of temperature sensors (discussed below) within the system (e.g., 100, FIG. 1), (ii) determining whether the temperature within the system (e.g., 100, FIG. 1) is below or above an appropriate operating temperature level (e.g., above 0° C.), (iii) initiating, based on the determination in (ii), a heating process (e.g., activating a heater component within a MECC (210)) to bring the IHSs (230A, 230B) into their designed operating temperature levels, (iv) initiating, based on the determination in (ii), a cooling process (e.g., activating a fluid mixture unit within the MECC (210)) to bring the IHSs (230A, 230B) into their designed operating temperature levels, (v) preventing damage (e.g., thermal runaway) to the heater component in the event of overheating, etc.

While described as a physical device, the ECC control panel may be implemented as a logical entity (e.g., a program executing using a number of printed circuit board components (not shown)). For example, an IHS (e.g., 230A) may host a program that provides the functionality of the ECC control panel.

In one or more embodiments, the ECC control panel may include one or more temperature sensors. The ECC control panel may include other types of sensors (e.g., humidity sensors, vibration sensors, corrosion sensors, differential pressure sensors, etc.) without departing from the scope of the invention. In one or more embodiments, one end of a temperature sensor may be operatively connected to at least one of the components (e.g., IHSs (230A, 230B)) within the system (e.g., 100, FIG. 1) to detect a temperature within the system (e.g., 100, FIG. 1). The other end of the temperature sensor may be operatively connected to the ECC control panel, in which the ECC control panel is configured to manage the components based on the temperature within the system (e.g., 100, FIG. 1).

In one or more embodiments, the UCC (240) may include a power distribution control unit (not shown) that is configured to determine which component(s) within the system (e.g., 100, FIG. 1) receive power from a modular power supply component (not shown). For example, when the heater component needs to be activated, the modular power supply component may be instructed (e.g., by the power distribution control unit) to distribute power to the heater component. As yet another example, the modular power supply component may be instructed to distribute power to the IHSs (230A, 230B).

In one or more embodiments, the modular power supply component may be designed by considering geographic factors of the customer site and custom requirements of the customer. The factors and the requirements may include, for example (but not limited to): a hurricane rating of a location, a required number of UPSs to support an operation, a required number of physical devices in a MECC, a required resiliency of a MECC, a required input power frequency, a required input voltage, etc.

The aforementioned examples are not intended to limit the scope of the invention.

In one or more embodiments, the modular power supply component may obtain customer facility's power (which comes from a centralized power station) and then may distribute the power (i.e., provide the power) to one or more components of the system (e.g., 100, FIG. 1).

In one or more embodiments, the modular power supply component may provide DC power to the components. The modular power supply component may include functionality to convert AC power (obtained from the centralized power station) to DC power.

In one or more embodiments, the modular power supply component may provide "N" or "2×N" power supply resiliency. In one or more embodiments, "N" resiliency may refer to having an exact number of components to operate. For example, if the system (e.g., 100, FIG. 1) needs "N" components to operate and if the system (e.g., 100, FIG. 1) has "N" components, this means that the system (e.g., 100, FIG. 1) has "N" resiliency. As yet another example, if the system (e.g., 100, FIG. 1) has "2×N" power supply resiliency, this means that the modular power supply component has a functionality to provide twice the amount of power needed for the system (e.g., 100, FIG. 1).

Further, if the modular power supply component provides a single power supply feed, then the system (e.g., 100, FIG. 1) will have a low level of resiliency. If there is an additional power supply feed (e.g., a separate busway), then the system (e.g., 100, FIG. 1) will have a high level of resiliency. Having an additional power capacity (e.g., having a redundant UPS, having a redundant battery, etc.) may ensure that the system (e.g., 100, FIG. 1) has no downtime while performing a service maintenance or experiencing a failure (e.g., a hardware failure, a software failure, etc.).

In one or more embodiments, apart from the modular power supply component, the power distribution control unit may include one or more backup power resources (e.g., batteries) to support an uninterrupted service (e.g., a temperature detection service, a power distribution management service, etc.) of the UCC (240).

In one or more embodiments, the UCC (240) may also include an access control unit (not shown) that is configured to control one or more security devices that are placed at various locations on the system (e.g., 100, FIG. 1). In one or more embodiments, a security device may be, for example (but not limited to): a padlock, a badge reader, an electrified mortise lock, a biometric reader-based access contact, etc. By using, for example, a biometric reader-based access contact, the access control unit may control access provided by access doors (ADs, discussed below) (258A-258C).

The aforementioned example is not intended to limit the scope of the invention.

In one or more embodiments, the access control unit may include a blank space (with power) to plug-in third-party security devices. If a customer has an existing security system at a customer site, the customer may install (e.g., mount) the existing security system within the blank space. In this manner, the customer may have a flexibility to use built-in security devices of the UCC (240) and/or to use the existing security system for access control.

As used herein, "mounting" a particular component on another component refers to positioning the particular component to be in physical contact with the other component, such that the other component provides structural support, positioning, structural load transfer, stabilization, shock absorption, some combination thereof, or the like with regard to the particular component.

Those skilled in the art will appreciate that while the IHSs (230A, 230B) and the UCC (240) are shown as located on a particular side of the MITC (220), the IHSs (230A, 230B) and the UCC (240) may be located on any other side of the MITC (220) without departing from the scope of the invention.

In one or more embodiments, the MITC (220) includes the AD (258A). Similarly, the UCC (240) includes the AD (258B). In one or more embodiments, the ADs (258A, 258B) may be walk-in doors or walk-up doors. For example, as a walk-in door, the AD (258A) may permit user access to the UCC (240). As yet another example, as a walk-in door, the AD (258B) may permit user access to an internal environment of the MITC (220).

The aforementioned examples are not intended to limit the scope of the invention.

In one or more embodiments, a walk-up door may be a mechanical "reach through" structure, in which "walk-up" refers to not being able to walk inside of, for example, the MECC (210). Said another way, the walk-up door (258C) has not enough space for a customer to step inside of the MECC (210). However, using the walk-up door (258C), the customer may access substantially a portion of an ECC (e.g., a direct expansion (DX) coil (245)) to perform a service type of event.

In one or more embodiments, the service type of event may include, for example (but not limited to): changing an actuator, changing a filter, changing a sensor, etc. In one or more embodiments, because the customer not being able to walk inside of the MECC (210), the customer may perform the event while standing outside of the MECC (210).

The aforementioned examples are not intended to limit the scope of the invention.

In one or more embodiments, a walk-in door may be a mechanical "walk through" structure, in which "walk-in" refers to being able to walk inside of, for example, the MECC (210) to perform at least a service type of event. In one or more embodiments, the walk-in door has a greater depth than the walk-up door. Said another way, the walk-in door has enough space (e.g., a walk-in space) for a customer to step inside of the walk-in door.

In one or more embodiments, for example, the AD (258A) includes a handle (not shown) that makes easier to open or close the AD (258A) to walk through or reach through the internal environment of the MITC (220). In this manner, the customer may perform a service type of event without standing outside of the MITC (220).

The aforementioned example is not intended to limit the scope of the invention.

In one or more embodiments, the ADs (258A-258C) may be wicket doors (e.g., a door in a door), in which the ADs (258A-258C) both include a person door and a rack door.

This means that the ADs (258A-258C) are big enough to pass a rack (not shown) through the ADs (258A-258C). In one or more embodiments, dotted arcs show an inward rotation or an outward rotation of the ADs (258A-258C).

Those skilled in the art will appreciate that while the ADs (258A, 258B) are shown as located on a rear side of the MITC (220) and a front side of the UCC (240), respectively, the ADs (258A, 258B) may be located on any other side of the MITC (220) and the UCC (240) without departing from the scope of the invention.

In one or more embodiments, the MITC (220) includes a connection interface, in which the connection interface is affixed to a pairing end of the MITC (220). The pairing end of the MITC (220) refers to a portion of the MITC (220) that can be paired with another component (e.g., the MECC (210)). In one or more embodiments, the connection interface of the MITC (220) includes mechanical and electrical connection components (MECCOMs) (250B). The connection interface of the MITC (220) also includes built-in airflow connection components.

In one or more embodiments, the mechanical connection components keep the MECC (210) connected to the MITC (220). The mechanical connection components also provide structural support to the MECC (210) and to the MITC (220) in case of a seismic event. The mechanical connection components may be, for example (but not limited to): steel plates with bolted connections, mechanical hard-stop components, sealing components, etc.

In one or more embodiments, "connected" may refer to "directly connected", in which there is a seal in between, for example, the connection interface of the MITC (220) and a connection interface of the MECC (210) (discussed below).

Alternatively, "connected" may refer to "connected via one or more physical components in between". For example, the connection interface of the MITC (220) is connected to the connection interface of the MECC (210), in which at least one physical component is mechanically touching the connection interfaces.

In one or more embodiments, the electrical connection components may transmit or receive power and data (e.g., temperature data, humidity data, etc.) to or from the MECC (210). For example, the UCC (240) may collect a temperature of one or more components within the MITC (220) as temperature data. Based on the collected data, the UCC (240) may activate or deactivate the MECC (210) using the electrical connection components.

In one or more embodiments, the airflow connection components may be ducting components that allow using either standard or custom designed MECCs. The airflow connection components may change (e.g., twist) a direction of an airflow formed between the MECC (210) and the MITC (220). For example, the MECC (210) may include a cold air ducting component and a hot air ducting component. The cold air ducting component may supply cold air into the MITC (220). The hot air ducting component may remove hot air from the MITC (220) and may deliver the hot air to the MECC (210).

The aforementioned examples are not intended to limit the scope of the invention.

As used herein, a "ducting component" includes any tube, pipe, conduit, or a combination thereof, that has one or more passageways through which a fluid or a gas can be conveyed. Examples of materials for a ducting component may include a cloth, a fabric, an extruded metal, a sheet metal, a polymer, or a combination thereof. A passageway of a ducting component may have any size and shape. The cross-section of a ducting component may be square, round, ovate, rectangular, or irregular. Further, a passageway of a ducting component may have a constant or changing cross-section, or a cross-section that changes over the length of the passageway.

In one or more embodiments, an area (e.g., height×width) enclosed by the connection interface of the MITC (220) is equal to an area enclosed by the connection interface of the MECC (210). In this manner, an end-to-end pairing between the MITC (220) and the MECC (210) may be installed for compatible mechanical, electrical, and airflow connections.

The MECC (210) may include one or more physical devices (e.g., ECCs) that alter characteristics (e.g., airflow directions, humidity of air, and temperature levels, etc.) of the internal environment of the MITC (220) at a macroscopic level. The physical devices may also ensure reliability of the IHSs (230A, 230B) and the UCC (240). In one or more embodiments, the physical devices may be affixed to a floor (e.g., a bottom side) of the MECC (210). In one or more embodiments, a physical device may be, for example (but not limited to): a fan (255), a DX coil (245), a fluid mixture unit, a heater component, an immersion cooling component, etc.

The aforementioned example is not intended to limit the scope of the invention.

In some cases, the system (e.g., 100, FIG. 1) may be deployed to environments that result in the temperature levels of the IHSs (230A, 230B) and the UCC (240) being outside of their designed operating temperature levels. For example, the IHSs (230A, 230B) may be designed to operate at temperature levels above 0° C. When the system (e.g., 100, FIG. 1) is deployed to an environment with harsh conditions (e.g., −40° C.-60° C.), the IHS (230A, 230B) may not operate properly and, in certain scenarios, may be damaged. To prevent the aforementioned issue, depending on environmental conditions, the physical devices either cool or heat the internal environment of the MITC (220). In this manner, stability and functionality of the IHSs (230A, 230B) and the UCC (240) may be preserved.

In one or more embodiments, as a gas mover, the fan (255) may be able to change a rate of gases being taken into and expelled from the IHSs (230A, 230B) and the UCC (240). As a refrigerant-based cooling technology, the DX coil (245) may cool the internal environment of the MITC (220) using a condensed refrigerant liquid (e.g., liquid nitrogen, hydrofluorocarbons (HFCs), etc.). In this technology, the refrigerant may expand to generate a cooling effect in the DX coil (245) that is in direct contact with a conditioned air, which will be supplied to the internal environment of the MITC (220).

In one or more embodiments, as a liquid cooling component, the fluid mixture unit may pump cooled fluid mixture (e.g., a mixture of water and glycerol) throughout hardware components (not shown) of the IHSs (230A, 230B) and the UCC (240). An absorbed air by the fluid mixture may then be transferred to an external environment of the MITC (220). Similar to refrigerant-based cooling technology, the fluid mixture unit may also use a DX coil; however, instead of using a refrigerant, the fluid mixture unit uses the fluid mixture. In one or more embodiments, glycerol may behave like an antifreeze liquid, in which the fluid mixture may operate at temperatures below 0° C.

In one or more embodiments, the MECC (210) may also take advantage of a cooling infrastructure that is already built-in at a customer site. For example, the MECC (210) may use a chilled water loop that is already available at the customer site.

As used herein, an "infrastructure" means system, components, or elements of a system that provide resources for a computing device, such as electrical power, data exchange capability with external systems, air, heat removal, and environmental control.

In one or more embodiments, the heater component may bring hardware components of the IHSs (230A, 230B) and the UCC (240) into their appropriate operating temperature levels (e.g., above 0° C.) when necessary. To initiate a heating process, the heater component may obtain a required power from the modular power supply component. The heater component may be made of silicon rubber, any other material, and/or any combination thereof that enables the heater component to perform its functions. Those skilled in the art will appreciate that the heater component may be supplied with power directly or indirectly (e.g., via a heating control component, a printed circuit board, etc.) without departing from the scope of the invention.

In one or more embodiments, the heater component has a number of surfaces that is heated and when air passes through the surfaces, an induced heat may be transferred from the heater component to the volume of air drawn into the internal environment of the MITC (220). In one or more embodiments, a number of heat sinks (not shown) may be used to provide a uniform distribution of heated volume of air drawn into the internal environment of the MITC (220) through their fins, in which a bottom portion of the number of heat sinks is affixed to the heater component. In this manner, a surface area of the heater component may be expanded indirectly to increase an efficiency of the heater component.

In one or more embodiments, the MECC (210) may provide "N+1" or "N+2" heating and/or cooling resiliency. In one or more embodiments, "N+1" cooling resiliency may indicate that even if one of the physical devices is deactivated (because of a service maintenance), the IHSs (230A, 230B) may still operate. For example, the MECC (210) has four fans and the MECC (210) has "N+1" resiliency. In this case, the required number of fans to support operation of the IHSs (230A, 230B) is three and the MECC (210) has a redundant fan. Having additional heating and/or cooling capacity (e.g., having a redundant fan, having a redundant heater component, etc.) may ensure that the IHSs (230A, 230B) has no downtime while performing a service maintenance or experiencing a failure.

In one or more embodiments, a power usage effectiveness (PUE) value of a component (e.g., an ECC, an IHS, etc.) at a data center indicates how energy efficient the component is. For example, as an ideal case, if a PUE value of an ECC is equal to one, this means that the ECC uses 100% of an input power that is provided to the ECC. In general, a PUE value of an ECC at a traditional data center is on average 1.57 (e.g., 64% effectiveness). Comparing to the PUE value of the ECC at the traditional data center, a PUE value of the MECC (210) is on average 1.01 (e.g., 99% efficiency)-1.043 (e.g., 95% efficiency), depending on where the system (e.g., 100, FIG. 1) is deployed. For example, if the system (e.g., 100, FIG. 1) is deployed to a hot environment (e.g., Phoenix, AZ), the PUE value of the MECC (210) may be 1.043. As yet another example, if the system (e.g., 100, FIG. 1) is deployed to a mild (e.g., neither hot nor cold) environment (e.g. San Diego, CA), the PUE value of the MECC (210) may be 1.01.

The aforementioned example is not intended to limit the scope of the invention.

In one or more embodiments, the MECC (210) supplies cold air (shown with a dashed line arrow) to the internal environment of the MITC (220) (including the UCC (240)) via the built-in airflow connection components. The MECC (210) also removes hot air (shown with a solid line arrow) from the internal environment of the MITC (220) (including the UCC (240)) via the built-in airflow connection components. In one or more embodiments, the dashed line and the solid line arrows inside of the MITC (220) may be referred to as a "cold aisle" and a "hot aisle", respectively.

The cold aisle may refer to an area (e.g., a space) in which conditioned (e.g., cold) air is introduced to a front side of the IHSs (230A, 230B) and to the UCC (240) to remove heat. The cold air may also be introduced to other components located within the internal environment of the MITC (220) without departing from the scope of the invention.

The hot aisle may refer to an area in which conditioned (e.g., hot) air is removed from a rear side of the IHSs (230A, 230B) and from the UCC (240) for the reliability of the IHSs (230A, 230B) and the UCC (240). The hot air may also be removed from other components located within the internal environment of the MITC (220) without departing from the scope of the invention.

In one or more embodiments, similar to MITC (220), the MECC (210) includes the AD (258C). In one or more embodiments, the AD (258C) may be a walk-in door or a walk-up door (as discussed above). For example, as a walk-in door, the AD (258C) may permit user access to the MECC (210).

The aforementioned example is not intended to limit the scope of the invention.

Those skilled in the art will appreciate that while the AD (258C) is shown as located on a right side of the MECC (210), the AD (258C) may be located on any other side of the MECC (210) without departing from the scope of the invention.

In one or more embodiments, as being separate components and as having separate ADs, once paired, the MITC (220) and the MECC (210) provide an additional security measure to the user access. For example, user 1 has access to the AD (258C) and user 2 has access to the ADs (258A-258C). In this case, because user 2 has access to all ADs, user 2 can access to the UCC (240), the MITC (220), and the MECC (210). However, because user 1 has access only to the AD (258C), user 1 cannot access to the UCC (240) and to the MITC (220).

The aforementioned example is not intended to limit the scope of the invention.

In one or more embodiments, similar to the MITC (220), the MECC (210) includes a connection interface, in which the connection interface is affixed to a pairing end of the MECC (210). The pairing end of the MECC (210) refers to a portion of the MECC (210) that can be paired with another component (e.g., the MITC (220)). In one or more embodiments, similar to the MITC (220), the connection interface of the MECC (210) includes MECCOMs (250A). The connection interface of the MECC (210) also includes the built-in airflow connection components.

In one or more embodiments, the MITC (220) and the MECC (210) are oriented in a same direction. Further, a double-headed arrow shows modularity of the system (e.g., 100, FIG. 1), in which the MECC (210) may be attached to, or detached from the MITC (220) along the same direction.

Those skilled in the art will appreciate that while the IHSs (230A, 230B) are oriented in parallel to the MECCOMs (250B), the IHSs (230A, 230B) may be oriented in any direction without departing from the scope of the invention.

In one or more embodiments, the end-to-end and medium form factor (e.g., medium shape) of the MDC (the system (e.g., 100, FIG. 1)) described in FIGS. 1 and 2.1 makes the system (e.g., 100, FIG. 1) deployable to, for example (but not limited to): space-unlimited locations, remote locations, etc. The space-unlimited locations may be, for example (but not limited to): university campuses, research and development locations, etc. The remote locations (e.g., edge locations) may be locations that are away from specialized IT and security personnel to maintain an operation of the MDC.

Providing multiple functionalities and fitting these functionalities into the medium form factor make formation, deployment, and operation of the end-to-end MDC easier for a customer that needs higher computing power. These functionalities also make possible to move from centralized cloud computing to decentralized edge computing. These functionalities may include, for example (but not limited to): a pre-integrated and ready-to-use IHS, an ability to plug into an existing security system, multiple ECC options, a high power resiliency, an optimized power distribution, higher power density within a data center, an easy service access, flexibility to support third-party components, a customer-specific component design, etc.

Further, a physical and functional split between the MECC (210) and the MITC (220) enables a variety of cooling technologies, capacities, and resiliencies to be paired with a variety of power capacities, resiliencies, and IHS technologies.

Turning now to FIG. 2.2, FIG. 2.2 shows a top view of the system of FIG. 1 in accordance with one or more embodiments of the invention. In an embodiment of the invention shown in FIG. 2.2, depending on how the IHSs (230A, 230B) are oriented, orientation of the FPs (215A, 215B) may be changed. For example, as shown in FIG. 2.1, the IHSs (230A, 230B) are oriented in a first direction, and as shown in FIG. 2.2, the IHSs (230A, 230B) are oriented in a second direction, in which the first direction and the second direction are perpendicular to each other. Because the orientation of the IHSs (230A, 230B) are changed from the first direction to the second direction, the orientation of the FPs (215A, 215B) are also changed from the first direction to the second direction.

In one or more embodiments, when the orientation of the IHSs (230A, 230B) are changed from the first direction to the second direction, the airflow connection components may include additional ducting components to twist the direction of an airflow formed between the MECC (210) and the MITC (220). For example, the airflow connection components may include a bottom ducting component and an overhead ducting component. The bottom ducting component may supply cold air (shown with dashed line arrows) to the internal environment of the MITC (220). The overhead ducting component may remove hot air (shown with solid line arrows) from the internal environment of the MITC (220). In one or more embodiments, the dashed line and the solid line arrows inside of the MITC (220) may be referred to as a cold aisle and a hot aisle, respectively.

The aforementioned examples are not intended to limit the scope of the invention.

Turning now to FIG. 2.3, FIG. 2.3 shows a diagram of the IHS (230A) in accordance with one or more embodiments of the invention. The IHS (230A) may include a rack (260) and any number of computing devices (e.g., 270).

In one or more embodiments, the rack (260) may be a mechanical structure that enables the computing devices to be positioned with respect to one another. For example, the rack (260) may be a mountable enclosure that enables the computing devices to be disposed within the rack (260). The rack (260) may be implemented as other types of structures adapted to host, position, orient, and/or otherwise physically, mechanically, electrically, and/or thermally manage the computing devices. By managing the computing devices, the rack (260) may enable the computing devices to be densely packed in a space without negatively impacting the operation of the IHS (230A).

In one or more embodiments, a computing device (e.g., 270) may be a mechanical structure for housing components of the IHS (230A). For example, the computing device (e.g., 270) may be implemented as a rack-mountable enclosure for housing components of the IHS (230A). The computing device (e.g., 270) may be adapted to be disposed within the rack (260) and/or utilize services provided by the rack (260) and/or other components available in the system (e.g., 100, FIG. 1).

In one or more embodiments, a computing device positioned into a pre-integrated rack may be ready-to-use (e.g., pre-configured with software, hardware, etc.) when deployed to the customer site. However, the customer may alter a configuration of the pre-configured computing device after the deployment. For example, the customer may increase memory capacity of the computing device after the deployment. As yet another example, the customer may increase processor capacity of the computing device after the deployment.

The aforementioned examples are not intended to limit the scope of the invention.

In one or more embodiments, one or more isolators (e.g., 310A, 310B, FIG. 3.1) may be attached to the components (e.g., the IHSs (e.g., 230A, 230B, FIG. 2.1), the FPs (e.g., 316A, 316B, etc.), etc.) of the system (e.g., 100, FIG. 1) to make sure that the components are ready-to-use when they deployed to the customer site. In one or more embodiments, the isolators provides a shock isolation to the components such that the components may be protected from any damage (e.g., a vibrational damage).

Turning now to FIG. 2.4, FIG. 2.4 shows a diagram of the computing device (270) in accordance with one or more embodiments of the invention. In one or more embodiments, the computing device (270) includes six sides (i.e., top, bottom, right, left, front, and rear), in which air drawn into from a front side of the computing device (e.g., via an air inlet (280)) and expelled from the rear side of the computing device (e.g., via one or more ECCs). An airflow direction is shown with a dashed line arrow (cold air) and a solid line arrow (hot air). In general, air incoming from the front side of the computing device (270) is cooler than air outgoing from the rear side of the computing device (270).

In one or more embodiments, to provide services, the computing device (270) may utilize resources provided by a number of hardware components hosted within the computing device (270). The hardware components may be, for example (but not limited to): processors, non-persistent storage devices, printed circuited boards, persistent storage devices, peripheral components interconnects, special purpose hardware components, etc. In one or more embodiments, some of the hardware components may be omitted or additional hardware components may be added based on the services provided by the computing device (270).

The aforementioned example is not intended to limit the scope of the invention.

As used herein, "computing" refers to any operations that may be performed by a computer, including (but not limited to): computation, data storage, data retrieval, communications, etc.

As used herein, a "computing device" includes any of various devices in which a computing operation may be carried out. A computing device may be, for example (but not limited to): a compute IHS component, a storage IHS component, a network device, a telecommunications component, etc.

The aforementioned examples are not intended to limit the scope of the invention.

In one or more embodiments, the medium form factor of the system described in FIG. 2.1 may increase a PUE value of the computing device (270). For example, because the system described in FIG. 2.1 includes a separate cooling and/or heating unit (210), the computing device (270) may not have a fan and/or a heating component. In this manner, the computing device (270) may become more power dense and power-efficient.

FIGS. 3.1-3.3 show an unloading process of an IHS from a floor in accordance with one or more embodiments of the invention.

Turning now to FIG. 3.1, FIG. 3.1 shows an initial stage of the unloading process in accordance with one or more embodiments of the invention. In an embodiment of the invention shown in FIG. 3.1, the embodiment includes a first IHS (304A), a second IHS (304B), a floor (including a first FP (316A) and a second FP (316B)), a first isolator (310A), a second isolator (310B), a first set of hydraulic pumps (HPs) (306A, 306B) (e.g., one or more HPs), a second set of HPs (306C, 306D), a first structural tube (308A), a second structural tube (308B), a locking mechanism (312), and a floor of the MITC (302). The IHSs (304A, 304B) may be the same as the IHSs (230A, 230B), respectively, discussed above in reference to FIG. 2.1. Similarly, the FPs (316A, 316B) may be the same as the FPs (215A, 215B), respectively, discussed above in reference to FIG. 2.1.

In one or more embodiments, the first isolator (310A) and the first set of HPs (306A, 306B) are located underneath the first FP (316A). In one or more embodiments, similar to the computing device (e.g., 270, FIG. 2.4), the first FP (316A) includes six sides, in which the first IHS (304A) is deployed to (e.g., loaded on) the top side of the first FP (316A). Similarly, the first isolator (310A) includes six sides, in which the top side of the first isolator (310A) is affixed to the bottom side of the first FP (316A). Further, the first structural tube (308A) includes six sides, in which the top side of the first structural tube (308A) is affixed to the bottom side of the first isolator (310A), and the bottom side of the first structural tube (308A) is affixed to the floor of the MITC (302). In one or more embodiments, the floor of the MITC (302) may be to the bottom side of the MITC (e.g., 220, FIG. 2.1).

In one or more embodiments, the top side of the first isolator (310A) may be affixed to the bottom side of the first FP (316A) using mechanical or non-mechanical mechanisms without departing from the scope of the invention. Similarly, the top side of the first structural tube (308A) may be affixed to the bottom side of the first isolator (310A) using mechanical or non-mechanical mechanisms without departing from the scope of the invention. Further, the bottom side of the first structural tube (308A) may be affixed to the floor of the MITC (302) using mechanical or non-mechanical mechanisms without departing from the scope of the invention.

In one or more embodiments, the first isolator (310A) makes sure that the first IHS (304A) (and the hardware components disposed within) are ready-to-use when the system (e.g., 100, FIG. 1) is deployed to the customer site. In one or more embodiments, when the first isolator (310A) is activated (e.g., when the locking mechanism and the first set of HPs are deactivated), the first isolator (310A) provides a shock isolation to the first IHS (304A) such that the hardware components disposed within the first IHS (304A) may be protected from any damage. For example, when the locking mechanism (312) and the first set of HPs (306A, 306B) are deactivated, the first isolator (310A) becomes activated, and the first isolator (310A) may move up and down. In this manner, the first isolator (310A) may provide a shock absorption to the first IHS (304A) while shipping the system (e.g., 100, FIG. 1) to the customer site. As yet another example, when the locking mechanism (312) and the first set of HPs (306A, 306B) are activated, the first isolator (310A) becomes deactivated, and the first isolator (310A) may not move up and down. For this reason, the first isolator (310A) may not provide a shock absorption to the first IHS (304A) while shipping the system (e.g., 100, FIG. 1) to the customer site, and this may be harmful or fatal to the hardware components of the first IHS (304A).

The aforementioned examples are not intended to limit the scope of the invention.

Those skilled in the art will appreciate that while the first FP (316A) is shown as connected to one isolator (e.g., the first isolator (310A)), the first FP (316A) may be connected to more isolators without departing from the scope of the invention.

Those skilled in the art will appreciate that while the first FP (316A) is shown as having a particular shape, the first FP (316A) may be in another shape (while still providing the same functionalities) without departing from the scope of the invention.

In one or more embodiments, a "structural tube" (or a "hollow structural section") is a component used in structural applications that rely on its structural and mechanical support capabilities. As having a high strength-to-weight ratio and as being a mechanical hard-stop component, a structural beam may provide one or more functionalities. For example, a structural tube (e.g., the first structural tube (308A)) may provide structural support to the first isolator (310A) and to the first FP (316A) in case of a seismic event. The first structural tube (308A) may also provide structural support to the first isolator (310A) to keep the first isolator (310A) connected to the first structural tube (308A).

The aforementioned example is not intended to limit the scope of the invention.

In one or more embodiments, the first structural tube (308A) (together with the first set of HPs (306A, 306B)) may provide structural support to the first FP (316A) when the first isolator (310A) is no longer operable (e.g., no longer provide a shock absorption even when activated). For example, when the first isolator (310A) is deformed because of a weight of the first HIS (304A), the first isolator (310A) may no longer be operable. In this case, the first structural tube (308A) and the first set of HPs (306A, 306B) may provide structural support to the first FP (316A) to prevent collapsing of the first FP (316A) to the floor of the MITC (302).

The aforementioned example is not intended to limit the scope of the invention.

In one or more embodiments, the first structural tube (308A) may be made of, for example (but not limited to): galvanized steel, stainless steel, sheet metal, aluminum, glass-fiber reinforced plastic, etc.

Those skilled in the art will appreciate that while a single structural tube (e.g., the first structural tube (308A)) is shown as located underneath the first FP (316A), more structural tubes may be located underneath the first FP (316A) without departing from the scope of the invention.

Those skilled in the art will appreciate that while the first structural tube (308A) is shown as having a particular shape, the first structural tube (308A) may be in another shape (while still providing the same functionalities) without departing from the scope of the invention.

In one or more embodiments, an "HP" is a component that converts electrical or mechanical energy into hydraulic energy (e.g., flow pressure, fluid power, etc.). An HP generates a flow with enough power to overcome pressure induced by a load at a pump outlet. During operation, an HP may generate a vacuum at a pump inlet, which may force hydraulic liquid from a reservoir into the pump inlet. By mechanical action (via valves and/or cylinders), the HP may then deliver the hydraulic liquid to the pump outlet to generate the hydraulic energy.

In one or more embodiments, the first set of HPs (306A, 306B) may be connected to each other via a hose to raise or lower the first FP (316A) evenly (e.g., uniformly). By raising or lowering, the first set of HPs (306A, 306B) may be used to bring the first FP (316A) into a correct position for easy and smooth IHS loading or unloading. For example, as shown in FIG. 3.1, the first HIS (304A) is loaded on the first FP (316A) and the second IHS (304B) is loaded on the second FP (316B), in which both FPs are oriented in a first plane (e.g., level) and the HPs (306A-306D) are deactivated. As shown in FIG. 3.2, after unloading the first IHS (304A) from the first FP (316A), the locking mechanism (312) is deactivated (discussed below). However, when the first IHS (304A) is unloaded and the locking mechanism (312) is deactivated (shown with a horizontal arrow), the first FP (316A) becomes oriented in a second plane (shown with a vertical arrow), in which the second plane is higher than the first plane. As shown in FIG. 3.3, in order to solve the FP level mismatch problem, the second set of HPs (306C, 306D) are activated to raise the second FP (316B) to the second plane (shown with a vertical arrow) to keep the first FP (316A) and the second FP (316B) in the second plane. Additional details of the FP raising process are described below in reference to FIG. 3.3.

The aforementioned example is not intended to limit the scope of the invention.

As discussed above, the first set of HPs (306A, 306B) may provide structural support to the first FP (316A) when the first isolator (310A) is no longer operable. In this case, for example, the first set of HPs (306A, 306B) may be activated (e.g., raised) to a certain level (i) to take the load off the first isolator (310A) and (ii) to replace the first isolator (310A) with an operable isolator. After replacing the first isolator (310A) with the operable isolator, the first set of HPs (306A, 306B) may be lowered to their previous level. The operable isolator may then start providing a shock isolation to the first FP (316A). In this manner, the first set of HPs (306A, 306B) may provide structural support to the first FP (316A).

The aforementioned example is not intended to limit the scope of the invention.

Those skilled in the art will appreciate that while the first set of HPs (306A, 306B) is shown as having a particular shape, the first set of HPs (306A, 306B) may be in another shape (while still providing the same functionalities) without departing from the scope of the invention.

In most cases, after raising or lowering a level of an FP to a level of a second FP, a customer may use a locking mechanism (e.g., the locking mechanism (312)) to keep the FPs at the same level and to prevent FP level mismatch issues. As shown in FIG. 3.1, the first FP (316A) includes the locking mechanism (312), in which the locking mechanism (312) is affixed (e.g., attached) to the bottom side of the first FP (316A). More specifically, the locking mechanism (312) is attached to a bottom side of an opening (314) of the first FP (316A).

In one or more embodiments, the locking mechanism (312) includes a tab (e.g., 420, FIG. 4.4), in which the tab (e.g., 420, FIG. 4.4) includes an indicator (e.g., 422, FIG. 4.4). In one or more embodiments, the tab (e.g., 420, FIG. 4.4) may have a functionality to be repositioned along the length of the opening (314). More specifically, a customer may move (e.g., shift, slide, etc.) the tab (e.g., 420, FIG. 4.4) along the length of the opening (314) towards to the second FP (316B) (a locked position, see FIG. 3.3), or the customer may slide the tab (e.g., 420, FIG. 4.4) along the length of the opening (314) towards to the first FP (316A) (an unlocked position, see FIG. 3.2). This means that the locking mechanism (312) is not welded to the first FP (316A).

In one or more embodiments, for example, as shown in FIG. 3.3, when the second FP (316B) is raised to the level of the first FP (316A) (e.g., to the second plane), the tab (e.g., 420, FIG. 4.4) slides towards to the second FP (316B) to keep the first FP (316A) and the second FP (316B) in the second plane. Said another way, the tab (e.g., 420, FIG. 4.4) slides into the locked (e.g., engaged) position to keep the first FP (316A) and the second FP (316B) in the second plane. In this manner, the activated locking mechanism (312) may provide a structural support to both FPs (316A, 316B) for easy and smooth IHS loading or unloading over time.

The aforementioned example is not intended to limit the scope of the invention.

In one or more embodiments, when the tab (e.g., 420, FIG. 4.4) slides into the locked position, the indicator (e.g., 422, FIG. 4.4) may show, through the opening (314), that the first FP (316A) and the second FP (316B) are aligned. Said another way, the indicator (e.g., 422, FIG. 4.4) may show, through the opening (314), that the first FP (316A) and the second FP (316B) are locked together.

In one or more embodiments, for example, prior to shipping the system (e.g., 100, FIG. 1) to the customer site, the locking mechanism (312) (and the HPs (306A-306D)) may be deactivated. In order to deactivate the locking mechanism (312), the tab (e.g., 420, FIG. 4.4) slides towards to the first FP (316A). Said another way, in order to deactivate the locking mechanism (312), the tab (e.g., 420, FIG. 4.4) slides into an unlocked (e.g., disengaged) position. In this manner, the isolators (310A, 310B) may be activated to provide a shock absorption to the IHSs (304A, 304B) while shipping the system (e.g., 100, FIG. 1) to the customer site.

The aforementioned example is not intended to limit the scope of the invention.

In one or more embodiments, when the tab (e.g., 420, FIG. 4.4) slides into the unlocked position, the indicator (e.g., 422, FIG. 4.4) may be hidden behind a portion of the first FP (316A). This means that the first FP (316A) and the second FP (316B) are not aligned. Said another way, the first FP (316A) and the second FP (316B) are not locked together.

In one or more embodiments, the indicator (e.g., 422, FIG. 4.4) may be, for example (but not limited to): a red-colored indicator, a light-emitting diode (LED) indicator, etc. Further, the tab (e.g., 420, FIG. 4.4) may be made of, for example (but not limited to): galvanized steel, stainless steel, sheet metal, aluminum, glass-fiber reinforced plastic, etc.

Those skilled in the art will appreciate that while the tab (e.g., 420, FIG. 4.4) is shown as having a particular shape, the tab (e.g., 420, FIG. 4.4) may be in another shape (while still providing the same functionalities) without departing from the scope of the invention.

Those skilled in the art will appreciate that while the opening (314) is shown as a rectangular opening, the opening (314) may be in another shape (while still providing the same functionalities) without departing from the scope of the invention.

In one or more embodiments, the second isolator (310B) and the second set of HPs (306C, 306D) are located underneath the second FP (316B). In one or more embodiments, similar to first FP (316A), the second FP (316B) includes six sides, in which the second IHS (304B) is loaded on the top side of the second FP (316B). Similarly, the second isolator (310B) includes six sides, in which the top side of the second isolator (310B) is affixed to the bottom side of the second FP (316B). Further, the second structural tube (308B) includes six sides, in which the top side of the second structural tube (308B) is affixed to the bottom side of the second isolator (310B), and the bottom side of the second structural tube (308B) is affixed to the floor of the MITC (302).

In one or more embodiments, the top side of the second isolator (310B) may be affixed to the bottom side of the second FP (316B) using mechanical or non-mechanical mechanisms without departing from the scope of the invention. Similarly, the top side of the second structural tube (308B) may be affixed to the bottom side of the second isolator (310B) using mechanical or non-mechanical mechanisms without departing from the scope of the invention. Further, the bottom side of the second structural tube (308B) may be affixed to the floor of the MITC (302) using mechanical or non-mechanical mechanisms without departing from the scope of the invention.

In one or more embodiments, the second isolator (310B) makes sure that the second IHS (304B) (and the hardware components disposed within) are ready-to-use when the system (e.g., 100, FIG. 1) is deployed to the customer site. In one or more embodiments, when the second isolator (310B) is activated (e.g., when the locking mechanism and the second set of HPs are deactivated), the second isolator (310B) provides a shock isolation to the second IHS (304B) such that the hardware components disposed within the second IHS (304B) may be protected from any damage. For example, when the locking mechanism (312) and the second set of HPs (306C, 306D) are deactivated, the second isolator (310B) becomes activated, and the second isolator (310B) may move up and down. In this manner, the second isolator (310B) may provide a shock absorption to the second IHS (304B) while shipping the system (e.g., 100, FIG. 1) to the customer site. As yet another example, when the locking mechanism (312) and the second set of HPs (306C, 306D) are activated, the second isolator (310B) becomes deactivated, and the second isolator (310B) may not move up and down. For this reason, the second isolator (310B) may not provide a shock absorption to the second IHS (304B) while shipping the system (e.g., 100, FIG. 1) to the customer site, and this may be harmful or fatal to the hardware components of the second IHS (304B).

The aforementioned examples are not intended to limit the scope of the invention.

Those skilled in the art will appreciate that while the second FP (316B) is shown as connected to one isolator (e.g., the second isolator (310B)), the second FP (316B) may be connected to more isolators without departing from the scope of the invention.

Those skilled in the art will appreciate that while the second FP (316B) is shown as having a particular shape, the second FP (316B) may be in another shape (while still providing the same functionalities) without departing from the scope of the invention.

In one or more embodiments, similar to the first structural tube (308A), the second structural tube (308B) may provide structural support to the second isolator (310B) and to the second FP (316B) in case of a seismic event. The second structural tube (308B) may also provide structural support to the second isolator (310B) to keep the second isolator (310B) connected to the second structural tube (308B).

In one or more embodiments, the second structural tube (308B) (together with the second set of HPs (306C, 306D)) may provide structural support to the second FP (316B) when the second isolator (310B) is no longer operable. For example, when the second isolator (310B) is deformed because of a weight of the second IHS (304B), the second isolator (310B) may no longer be operable. In this case, the second structural tube (308B) and the second set of HPs (306C, 306D) may provide structural support to the second FP (316B) to prevent collapsing of the second FP (316B) to the floor of the MITC (302).

The aforementioned example is not intended to limit the scope of the invention.

In one or more embodiments, the second structural tube (308B) may be made of, for example (but not limited to): galvanized steel, stainless steel, sheet metal, aluminum, glass-fiber reinforced plastic, etc.

Those skilled in the art will appreciate that while a single structural tube (e.g., the second structural tube (308B)) is shown as located underneath the second FP (316B), more structural tubes may be located underneath the second FP (316B) without departing from the scope of the invention.

Those skilled in the art will appreciate that while the second structural tube (308B) is shown as having a particular shape, the second structural tube (308B) may be in another shape (while still providing the same functionalities) without departing from the scope of the invention.

In one or more embodiments, the second set of HPs (306C, 306D) may be connected to each other via a hose to raise or lower the second FP (316B) evenly. By raising or lowering, the second set of HPs (306C, 306D) may be used to bring the second FP (316B) into a correct position for easy and smooth IHS loading or unloading. For example, as shown in FIG. 3.1, the first IHS (304A) is loaded on the first FP (316A) and the second IHS (304B) is loaded on the second FP (316B), in which both FPs are oriented in a first plane and the HPs (306A-306D) are deactivated. As shown in FIG. 3.2, after unloading the first IHS (304A) from the first FP (316A), the locking mechanism (312) is deactivated. However, when the first IHS (304A) is unloaded and the locking mechanism (312) is deactivated (shown with a horizontal arrow), the second FP (316B) stays oriented in the first plane. As shown in FIG. 3.3, in order to solve the FP level mismatch problem, the second set of HPs (306C, 306D) are activated to raise the second FP (316B) to the second plane (shown with a vertical arrow) to keep the first FP (316A) and the second FP (316B) in the second plane.

The aforementioned example is not intended to limit the scope of the invention.

As discussed above, the second set of HPs (306C, 306D) may provide structural support to the second FP (316B) when the second isolator (310B) is no longer operable. In this case, for example, the second set of HPs (306C, 306D) may be activated (e.g., raised) to a certain level (i) to take the load off the second isolator (310B) and (ii) to replace the second isolator (310B) with an operable isolator. After replacing the second isolator (310B) with the operable isolator, the second set of HPs (306C, 306D) may be lowered to their previous level. The operable isolator may then start providing a shock isolation to the second FP (316B). In this manner, the second set of HPs (306C, 306D) may provide structural support to the second FP (316B).

The aforementioned example is not intended to limit the scope of the invention.

Those skilled in the art will appreciate that while the second set of HPs (306C, 306D) is shown as having a particular shape, the second set of HPs (306C, 306D) may be in another shape (while still providing the same functionalities) without departing from the scope of the invention.

In one or more embodiments, because the FPs (316A, 316B) are located on top of the isolators (310A, 310B) and the HPs (306A-306D), the floor may be referred to as a "raised floor".

As used herein, a "raised floor" is a data center construction model where a slightly higher floor is constructed above a floor (e.g., a bottom side) of the data center. A raised floor allows to generate an open space between the two floors for a better (i) cold air distribution (via, for example, bottom ducting components), (ii) air containment, and (iii) cable management within the data center.

Turning now to FIG. 3.2, FIG. 3.2 shows an intermediate stage of the unloading process in accordance with one or more embodiments of the invention. In an embodiment of the invention shown in FIG. 3.2, the first IHS (e.g., 304A, FIG. 3.1) is unloaded from the first FP (316A). After unloading the first IHS (e.g., 304A, FIG. 3.1), the locking mechanism (312) is deactivated by sliding the tab (e.g., 420, FIG. 4.4) towards to the first FP (316A) (shown with a horizontal arrow). In this manner, the isolators (310A, 310B) are activated to provide a shock absorption to components (e.g., 304B) loaded on the FPs (316A, 316B).

After deactivating the locking mechanism (312), the first FP (316A) becomes oriented in the second plane (shown with a vertical arrow); however, the second FP (316B) stays oriented in the first plane, in which the second plane is higher than the first plane. This means that the first FP (316A) and the second FP (316B) are no longer aligned and this may affect IHS loading or unloading on or from the floor negatively.

In one or more embodiments, after the locking mechanism (312) is deactivated, the first isolator (310A) expands to adapt the orientation change of the first FP (316A). The HPs (306A-306D) stay deactivated; however, the first set of HPs (306A, 306B) is no longer interface with the bottom side of the first FP (316A) because of the orientation change of the first FP (316A).

Turning now to FIG. 3.3, FIG. 3.3 shows a final stage of the unloading process in accordance with one or more embodiments of the invention. In an embodiment of the invention shown in FIG. 3.3, in order to solve the FP level mismatch problem, the second set of HPs (306C, 306D) are activated to raise the second FP (316B) to the second plane (shown with a vertical arrow) to keep the first FP (316A) and the second FP (316B) in the second plane. After raising the second FP (316B) to the second plane, the tab (e.g., 420, FIG. 4.4) slides towards to the second FP (316B) (shown with a horizontal arrow) to keep the first FP (316A) and the second FP (316B) in the second plane. In this manner, the activated locking mechanism (312) provides a structural support to both FPs (316A, 316B) for easy and smooth IHS loading or unloading over time. Further, when the tab (e.g., 420, FIG. 4.4) slides into the locked position, the indicator (e.g., 422, FIG. 4.4) shows, through the opening (e.g., 314, FIG. 3.1), that the first FP (316A) and the second FP (316B) are aligned.

As shown in FIG. 3.3, in order to raise the second FP (316B) to the second plane, the second set of HPs (306C, 306D) become larger (e.g., taller) comparing to their sizes in FIG. 3.1. Because the second set of HPs (306C, 306D) are activated to raise the second FP (316B) to the second plane, the second set of HPs (306C, 306D) takes the load off the second isolator (310B). For this reason, the second isolator (310B) is deactivated and may not provide a shock absorption to the second IHS (304B), for example, while shipping the system (e.g., 100, FIG. 1) to the customer site.

FIGS. 4.1-4.3 show a loading process of an IHS on a floor in accordance with one or more embodiments of the invention.

Turning now to FIG. 4.1, FIG. 4.1 shows an initial stage of the loading process in accordance with one or more embodiments of the invention. In an embodiment of the invention shown in FIG. 4.1, the embodiment includes a floor (including a first FP (416A) and a second FP (416B)), a first isolator (410A), a second isolator (410B), a first set of HPs (406A, 406B), a second set of HPs (406C, 406D), a first structural tube (408A), a second structural tube (408B), a locking mechanism (412), and a floor of the MITC (402). In an embodiment of the invention shown in FIG. 4.1, the components may be the same as the components of the embodiment shown in FIG. 3.1.

In one or more embodiments, the first isolator (410A) and the first set of HPs (406A, 406B) are located underneath the first FP (416A). In one or more embodiments, the first FP (416A) includes six sides, in which an IHS (e.g., 304A, FIG. 3.1) may be loaded on the top side of the first FP (416A). Similarly, the first isolator (410A) includes six sides, in which the top side of the first isolator (410A) is affixed to the bottom side of the first FP (416A). Further, the first structural tube (408A) includes six sides, in which the top side of the first structural tube (408A) is affixed to the bottom side of the first isolator (410A), and the bottom side of the first structural tube (408A) is affixed to the floor of the MITC (402).

In one or more embodiments, the top side of the first isolator (410A) may be affixed to the bottom side of the first FP (416A) using mechanical or non-mechanical mechanisms without departing from the scope of the invention. Similarly, the top side of the first structural tube (408A) may be affixed to the bottom side of the first isolator (410A) using mechanical or non-mechanical mechanisms without departing from the scope of the invention. Further, the bottom side of the first structural tube (408A) may be affixed to the floor of the MITC (402) using mechanical or non-mechanical mechanisms without departing from the scope of the invention.

As shown in FIG. 4.1, the first isolator (410A) is activated, and the locking mechanism (412) and the first set of HPs (406A, 406B) are deactivated. In this manner, (i) when an IHS is loaded on the first FP (416A), the first isolator (410A) may provide a shock isolation to that IHS (and the hardware components disposed within) to protect it from any damage, and (ii) the first isolator (410A) makes sure that the IHS (and the hardware components disposed within) are ready-to-use when the system (e.g., 100, FIG. 1) is deployed to the customer site.

Those skilled in the art will appreciate that while the first FP (416A) is shown as connected to one isolator (e.g., the first isolator (410A)), the first FP (416A) may be connected to more isolators without departing from the scope of the invention.

Those skilled in the art will appreciate that while the first FP (416A) is shown as having a particular shape, the first FP (416A) may be in another shape (while still providing the same functionalities) without departing from the scope of the invention.

In one or more embodiments, the first structural tube (408A) may provide structural support to the first isolator (410A) and to the first FP (416A) in case of a seismic event. The first structural tube (408A) may also provide structural support to the first isolator (410A) to keep the first isolator (410A) connected to the first structural tube (408A).

In one or more embodiments, the first structural tube (408A) (together with the first set of HPs (406A, 406B)) may provide structural support to the first FP (416A) when the first isolator (410A) is no longer operable. For example, when the first isolator (410A) is deformed because of a weight of an IHS loaded on the first FP (416A), the first isolator (410A) is no longer operable. In this case, the first structural tube (408A) and the first set of HPs (406A, 406B) may provide structural support to the first FP (416A) to prevent collapsing of the first FP (416A) to the floor of the MITC (402).

The aforementioned example is not intended to limit the scope of the invention.

Those skilled in the art will appreciate that while a single structural tube (e.g., the first structural tube (408A)) is shown as located underneath the first FP (416A), more structural tubes may be located underneath the first FP (416A) without departing from the scope of the invention.

Those skilled in the art will appreciate that while the first structural tube (408A) is shown as having a particular shape, the first structural tube (408A) may be in another shape (while still providing the same functionalities) without departing from the scope of the invention.

In one or more embodiments, the first set of HPs (406A, 406B) may be connected to each other via a hose to raise or lower the first FP (416A) evenly. By raising or lowering, the first set of HPs (406A, 406B) may be used to bring the first FP (416A) into a correct position for easy and smooth IHS loading or unloading. For example, as shown in FIG. 4.1, both FPs (416A, 416B) are oriented in a first plane and the HPs (406A-406D) are deactivated. However, as shown in FIG. 4.2, when an IHS is loaded on the second FP (416B), the second FP (416B) becomes oriented in a second plane (shown with a horizontal arrow), in which the second plane is lower than the first plane. In order to solve the FP level mismatch problem, as shown in FIG. 4.3, the second set of HPs (406C, 406D) are activated to raise the second FP (416B) to the first plane to keep the first FP (416A) and the second FP (416B) in the first plane. Additional details of the FP raising process are described below in reference to FIG. 4.3.

The aforementioned example is not intended to limit the scope of the invention.

As discussed above, the first set of HPs (406A, 406B) may provide structural support to the first FP (416A) when the first isolator (410A) is no longer operable. In this case, for example, the first set of HPs (406A, 406B) may be activated (e.g., raised) to a certain level (i) to take the load off the first isolator (410A) and (ii) to replace the first isolator (410A) with an operable isolator. After replacing the first isolator (410A) with the operable isolator, the first set of HPs (406A, 406B) may be lowered to their previous level. The operable isolator may then start providing a shock isolation to the first FP (416A). In this manner, the first set of HPs (406A, 406B) may provide structural support to the first FP (416A).

The aforementioned example is not intended to limit the scope of the invention.

Those skilled in the art will appreciate that while the first set of HPs (406A, 406B) is shown as having a particular shape, the first set of HPs (406A, 406B) may be in another shape (while still providing the same functionalities) without departing from the scope of the invention.

As discussed in FIG. 3.1, after raising or lowering a level of a FP into a level of a second FP, a customer may use a locking mechanism (e.g., the locking mechanism (412)) to keep the FPs at the same level and to prevent FP level mismatch issues. As shown in FIG. 4.1, the first FP (416A) includes the locking mechanism (412), in which the locking mechanism (412) is affixed to the bottom side of the first FP (416A). More specifically, the locking mechanism (412) is attached to a bottom side of an opening (414) of the first FP (416A). Details of the locking mechanism are described above in reference to FIG. 3.1.

In one or more embodiments, for example, as shown in FIG. 4.3, when the second FP (416B) is raised to the level of the first FP (416A) (e.g., to the first plane), the tab (e.g., 420, FIG. 4.4) slides towards to the second FP (416B) to keep the first FP (416A) and the second FP (416B) in the first plane. Said another way, the tab (e.g., 420, FIG. 4.4) slides into the locked position to keep the first FP (416A) and the second FP (416B) in the first plane. In this manner, the activated locking mechanism (412) may provide a structural support to both FPs (416A, 416B) for easy and smooth IHS loading or unloading over time.

The aforementioned example is not intended to limit the scope of the invention.

In one or more embodiments, when the tab (e.g., 420, FIG. 4.4) slides into the locked position, the indicator (e.g., 422, FIG. 4.4) may show, through the opening (414), that the first FP (416A) and the second FP (416B) are aligned. Said another way, the indicator (e.g., 422, FIG. 4.4) may show, through the opening (414), that the first FP (416A) and the second FP (416B) are locked together.

Referring to FIG. 4.3, for example, prior to shipping the system (e.g., 100, FIG. 1) to the customer site, the locking mechanism (412) (and the second set of HPs (406C, 406D)) may be deactivated. In order to deactivate the locking mechanism (412), the tab (e.g., 420, FIG. 4.4) slides towards to the first FP (416A). Said another way, in order to deactivate the locking mechanism (412), the tab (e.g., 420, FIG. 4.4) slides into the unlocked position. In this manner, the second isolator (410B) may be activated to provide a shock absorption to the IHS (404) while shipping the system (e.g., 100, FIG. 1) to the customer site.

The aforementioned example is not intended to limit the scope of the invention.

In one or more embodiments, when the tab (e.g., 420, FIG. 4.4) slides into the unlocked position, the indicator (e.g., 422, FIG. 4.4) may be hidden behind a portion of the first FP (416A). This means that the first FP (416A) and the second FP (416B) are not aligned. Said another way, the first FP (416A) and the second FP (416B) are not locked together.

Those skilled in the art will appreciate that while the opening (414) is shown is a rectangular opening, the opening (414) may be in another shape (while still providing the same functionalities) without departing from the scope of the invention.

In one or more embodiments, the second isolator (410B) and the second set of HPs (406C, 406D) are located underneath the second FP (416B). In one or more embodiments, similar to first FP (416A), the second FP (416B) includes six sides, in which a second IHS (e.g., IHS (404)) may be loaded on the top side of the second FP (416B). Similarly, the second isolator (410B) includes six sides, in which the top side of the second isolator (410B) is affixed to the bottom side of the second FP (416B). Further, the second structural tube (408B) includes six sides, in which the top side of the second structural tube (408B) is affixed to the bottom side of the second isolator (410B), and the bottom side of the second structural tube (408B) is affixed to the floor of the MITC (402).

In one or more embodiments, the top side of the second isolator (410B) may be affixed to the bottom side of the second FP (416B) using mechanical or non-mechanical mechanisms without departing from the scope of the invention. Similarly, the top side of the second structural tube (408B) may be affixed to the bottom side of the second isolator (410B) using mechanical or non-mechanical mechanisms without departing from the scope of the invention. Further, the bottom side of the second structural tube (408B) may be affixed to the floor of the MITC (402) using mechanical or non-mechanical mechanisms without departing from the scope of the invention.

Similar to the first isolator (410A), the second isolator (410B) is activated. In this manner, (i) when an IHS is loaded on the second FP (416B), the second isolator (410B) may provide a shock isolation to that IHS (and the hardware components disposed within) to protect it from any damage, and (ii) the second isolator (410B) makes sure that the IHS (and the hardware components disposed within) are ready-to-use when the system (e.g., 100, FIG. 1) is deployed to the customer site.

Those skilled in the art will appreciate that while the second FP (416B) is shown as connected to one isolator (e.g., the second isolator (410B)), the second FP (416B) may be connected to more isolators without departing from the scope of the invention.

Those skilled in the art will appreciate that while the second FP (416B) is shown as having a particular shape, the second FP (416B) may be in another shape (while still providing the same functionalities) without departing from the scope of the invention.

In one or more embodiments, the second structural tube (408B) may provide structural support to the second isolator (410B) and to the second FP (416B) in case of a seismic event. The second structural tube (408B) may also provide structural support to the second isolator (410B) to keep the second isolator (410B) connected to the first structural tube (408B).

In one or more embodiments, the second structural tube (408B) (together with the second set of HPs (406C, 406D)) may provide structural support to the second FP (416B) when the second isolator (410B) is no longer operable. For example, when the second isolator (410B) is deformed because of a weight of the IHS (404) loaded on the second FP (416B), the second isolator (410B) is no longer operable. In this case, the second structural tube (408B) and the second set of HPs (406C, 406D) may provide structural support to the second FP (416B) to prevent collapsing of the second FP (416B) to the floor of the MITC (402).

The aforementioned example is not intended to limit the scope of the invention.

Those skilled in the art will appreciate that while a single structural tube (e.g., the second structural tube (408B)) is shown as located underneath the second FP (416B), more structural tubes may be located underneath the second FP (416B) without departing from the scope of the invention.

Those skilled in the art will appreciate that while the second structural tube (408B) is shown as having a particular shape, the second structural tube (408B) may be in another shape (while still providing the same functionalities) without departing from the scope of the invention.

In one or more embodiments, the second set of HPs (406C, 406D) may be connected to each other via a hose to raise or lower the second FP (416B) evenly. By raising or lowering, the second set of HPs (406C, 406D) may be used to bring the second FP (416B) into a correct position for easy and smooth IHS loading or unloading. As discussed above, for example, in order to solve the FP level mismatch problem shown in FIG. 4.3, the second set of HPs (406C, 406D) are activated to raise the second FP (416B) to the first plane to keep the first FP (416A) and the second FP (416B) in the first plane.

The aforementioned example is not intended to limit the scope of the invention.

Similar to the first set of HPs (406A, 406B), the second set of HPs (406C, 406D) may provide structural support to the second FP (416B) when the second isolator (410B) is no longer operable. In this case, for example, the second set of HPs (406C, 406D) may be activated (e.g., raised) to a certain level (i) to take the load off the second isolator (410B) and (ii) to replace the second isolator (410B) with an operable isolator. After replacing the second isolator (410B) with the operable isolator, the second set of HPs (406C, 406D) may be lowered to their previous level. The operable isolator may then start providing a shock isolation to the second FP (416B). In this manner, the second set of HPs (406C, 406D) may provide structural support to the second FP (416B).

The aforementioned example is not intended to limit the scope of the invention.

Those skilled in the art will appreciate that while the second set of HPs (406C, 406D) is shown as having a particular shape, the second set of HPs (406C, 406D) may be in another shape (while still providing the same functionalities) without departing from the scope of the invention.

Turning now to FIG. 4.2, FIG. 4.2 shows an intermediate stage of the loading process in accordance with one or more embodiments of the invention. In an embodiment of the invention shown in FIG. 4.2, the IHS (404) is loaded on the second FP (416B). The IHS (404) may be the same as the IHS (304D) discussed above in reference to FIG. 3.1. After loading the IHS (404) on the second FP (416B), the second FP (416B) becomes oriented in the second plane (shown with a horizontal arrow), in which the second plane is lower than the first plane.

As shown in FIG. 4.2, after loading the IHS (404) on the second FP (416B), the first FP (416A) stays oriented in the first plane, which means that the first FP (416A) and the second FP (416B) are no longer aligned. For this reason, IHS loading or unloading, on or from the floor, may be affected negatively.

In one or more embodiments, while loading the IHS (404) on the second FP (416B), the second isolator (410B) compresses to adapt the orientation change of the second FP (416B). The HPs (406A-406D) stay deactivated; however, the second set of HPs (406C, 406D) starts to interface with the bottom side of the second FP (416B) because of the orientation change of the second FP (416B).

Turning now to FIG. 4.3, FIG. 4.3 shows a final stage of the loading process in accordance with one or more embodiments of the invention. In an embodiment of the invention shown in FIG. 4.3, in order to solve the FP level mismatch problem, the second set of HPs (406C, 406D) are activated to raise the second FP (416B) to the first plane (shown with a vertical arrow) to keep the first FP (416A) and the second FP (416B) in the first plane. After raising the second FP (416B) to the second plane, the tab (e.g., 420, FIG. 4.4) slides towards to the second FP (416B) (shown with a horizontal arrow) to keep the first FP (416A) and the second FP (416B) in the first plane. In this manner, the activated locking mechanism (412) provides a structural support to both FPs (416A, 416B) for easy and smooth IHS loading or unloading over time. Further, when the tab (e.g., 420, FIG. 4.4) slides into the locked position, the indicator (e.g., 422, FIG. 4.4) shows, through the opening (e.g., 414, FIG. 4.1), that the first FP (416A) and the second FP (416B) are aligned.

As shown in FIG. 4.3, in order to raise the second FP (416B) to the first plane, the second set of HPs (406C, 406D) become taller comparing to their sizes in FIG. 4.1. Because the second set of HPs (406C, 406D) are activated to raise the second FP (416B) to the first plane, the second set of HPs (406C, 406D) takes the load off the second isolator (410B). For this reason, the second isolator (410B) is deactivated and may not provide a shock absorption to the IHS (404), for example, while shipping the system (e.g., 100, FIG. 1) to the customer site.

Turning now to FIG. 4.4, FIG. 4.4 shows a top view of the first FP (416A) in accordance with one or more embodiments of the invention. In an embodiment of the invention shown in FIG. 4.4, the first FP (416) includes the opening (414), the tab (420), and the indicator (422).

In one or more embodiments, the tab (420) has a functionality to be repositioned along the length of the opening (414). More specifically, a customer may slide the tab (420) along the length of the opening (414) towards to the second FP (e.g., 416B, FIG. 4.3) (a locked position, see FIG. 4.3), or the customer may slide the tab (420) along the length of the opening (414) towards to the first FP (416A) (an unlocked position).

In one or more embodiments, when the tab (420) slides into the locked position (shown with a double-headed arrow), the indicator (422) may show, through the opening (414), that the first FP (416A) and the second FP (e.g., 416B, FIG. 4.3) are aligned. Said another way, the indicator (422) may show, through the opening (414), that the first FP (416A) and the second FP (e.g., 416B, FIG. 4.3) are locked together.

In one or more embodiments, when the tab (e.g., 420, FIG. 4.4) slides into the unlocked position (shown with a double-headed arrow), the indicator (422) may be hidden behind a portion of the first FP (416A). This means that the first FP (416A) and the second FP (416B) are not aligned. Said another way, the first FP (416A) and the second FP (416B) are not locked together. Details of the tab, opening, and the indicator are described above in reference to FIGS. 3.1-3.3.

Those skilled in the art will appreciate that while the opening (414) is shown as having a particular size, shape, and placement, the opening (414) may have any size, shape, and placement (while still providing the same functionalities) without departing from the scope of the invention.

The problems discussed throughout this application should be understood as being examples of problems solved by embodiments described herein, and the various embodiments should not be limited to solving the same/similar problems. The disclosed embodiments are broadly applicable to address a range of problems beyond those discussed herein.

While embodiments discussed herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A modular information technology component (MITC), comprising:
    a floor, wherein the floor comprises a first floor plate (FP) and a second FP, wherein the first FP and the second FP are oriented in a first plane; and
    a first hydraulic pump (HP) and a second HP, wherein the first HP is located underneath the first FP, wherein the second HP is located underneath the second FP, wherein the first HP and the second HP are deactivated, wherein, when an information handling system (IHS) is loaded on the second FP, the second FP becomes oriented in a second plane, wherein the second plane is lower than the first plane, and
    wherein, when the second FP becomes oriented in the second plane, the second HP is activated to raise the second FP to the first plane.

2. The MITC of claim 1, further comprising:
    a first isolator and a second isolator,
    wherein the first isolator is located underneath the first FP,
    wherein the second isolator is located underneath the second FP,
    wherein the first isolator provides a first shock isolation to the first FP, and
    wherein the second isolator provides a second shock isolation to the second FP.

3. The MITC of claim 2, wherein the first isolator is affixed to the first FP and the second isolator is affixed to the second FP.

4. The MITC of claim 2,
    wherein, when the second FP becomes oriented in the second plane, the second isolator compresses to adapt the orientation change of the second FP.

5. The MITC of claim 2,
    wherein, after the second HP raises the second FP to the first plane, the second isolator becomes deactivated.

6. The MITC of claim 1, further comprising:
    a locking mechanism,
    wherein the locking mechanism comprises a tab,
    wherein the first FP comprises an opening, wherein the locking mechanism is attached to the opening,
    wherein, when the second FP is raised to the first plane, the tab slides into a locked position to keep the first FP and the second FP in the first plane, and
    wherein, when tab slides into the locked position, the tab slides towards to the second FP.

7. The MITC of claim 6,
    wherein the locking mechanism further comprises an indicator, and
    wherein, when the tab slides into the locked position, the indicator shows, through the opening, that the first FP and the second FP are aligned.

8. The MITC of claim 1, wherein the IHS comprises a rack and a plurality of computing devices, wherein the rack is a housing for the plurality of computing devices.

9. A modular information technology component (MITC), comprising:
    a floor, wherein the floor comprises a first floor plate (FP) and a second FP, wherein the first FP and the second FP are oriented in a first plane; and a first hydraulic pump (HP) and a second HP, wherein the first HP is located underneath the first FP, wherein the second HP is located underneath the second FP, wherein the first HP and the second HP are deactivated, wherein a first information handling system (IHS) is loaded on the first FP and a second IHS is loaded on the second FP, wherein, when the first IHS is unloaded from the first FP, the first FP becomes oriented in a second plane, wherein the second plane is higher than the first plane, wherein, when the first FP becomes oriented in the second plane, the second HP is activated to raise the second FP to the second plane.

10. The MITC of claim 9, further comprising:
a first isolator and a second isolator,
wherein the first isolator is located underneath the first FP,
wherein the second isolator is located underneath the second FP,
wherein the first isolator provides a first shock isolation to the first FP, and
wherein the second isolator provides a second shock isolation to the second FP.

11. The MITC of claim 10, wherein the first isolator is affixed to the first FP and the second isolator is affixed to the second FP.

12. The MITC of claim 10,
wherein, when the first FP becomes oriented in the second plane, the first isolator becomes activated.

13. The MITC of claim 10,
wherein, after the second HP raises the second FP to the second plane, the second isolator becomes deactivated.

14. The MITC of claim 9, further comprising:
a locking mechanism,
wherein the locking mechanism comprises a tab,
wherein the first FP comprises an opening, wherein the locking mechanism is attached to the opening,
wherein, when the second FP is raised to the second plane, the tab slides into a locked position to keep the first FP and the second FP in the second plane, and
wherein, when tab slides into the locked position, the tab slides towards to the second FP.

15. The MITC of claim 14,
wherein the locking mechanism further comprises an indicator, and
wherein, when the tab slides into the locked position, the indicator shows, through the opening, that the first FP and the second FP are aligned.

16. The MITC of claim 9, wherein the IHS comprises a rack and a plurality of computing devices,
wherein the rack is a housing for the plurality of computing devices.

17. A modular data center, comprising:
a modular information technology component (MITC),
wherein the MITC comprises a floor, a first hydraulic pump (HP), and a second HP,
wherein the floor comprises a first floor plate (FP) and a second FP, wherein the first FP and the second FP are oriented in a first plane,
wherein the first HP is located underneath the first FP, wherein the second HP is located underneath the second FP, wherein the first HP and the second HP are deactivated,
wherein, when an information handling system (IHS) is loaded on the second FP, the second FP becomes oriented in a second plane, wherein the second plane is lower than the first plane, and
wherein, when the second FP becomes oriented in the second plane, the second HP is activated to raise the second FP to the first plane; and
a modular environmental control component (MECC),
wherein the MECC comprises a plurality of environmental control components (ECCs) and built-in airflow connection components, wherein the built-in airflow connection components remove and supply air to the MITC.

18. The modular data center of claim 17, further comprising:
a first isolator and a second isolator,
wherein the first isolator is located underneath the first FP,
wherein the second isolator is located underneath the second FP,
wherein the first isolator provides a first shock isolation to the first FP, and
wherein the second isolator provides a second shock isolation to the second FP.

19. The modular data center of claim 18, wherein the first isolator is affixed to the first FP and the second isolator is affixed to the second FP.

20. The modular data center of claim 18,
wherein, when the second FP becomes oriented in the second plane, the second isolator compresses to adapt the orientation change of the second FP.

* * * * *